US008604858B2

(12) United States Patent  
Jang et al.

(10) Patent No.: US 8,604,858 B2  
(45) Date of Patent: Dec. 10, 2013

(54) GATE DRIVING CIRCUIT

(75) Inventors: Yong-Ho Jang, Goyang-si (KR);  
Seung-Chan Choi, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 8 days.

(21) Appl. No.: 13/402,017

(22) Filed: Feb. 22, 2012

(65) Prior Publication Data  
US 2012/0212275 A1 Aug. 23, 2012

(30) Foreign Application Priority Data

Feb. 22, 2011 (KR) .................. 10-2011-0015738  
Jul. 5, 2011 (KR) .................. 10-2011-0066276

(51) Int. Cl.  
*G06F 1/04* (2006.01)  
*H03K 3/00* (2006.01)

(52) U.S. Cl.  
USPC ............ 327/291; 327/108; 327/295; 327/299

(58) Field of Classification Search  
USPC .................. 327/108, 110, 291, 295  
See application file for complete search history.

(56) References Cited

U.S. PATENT DOCUMENTS 6,856,184 B2 * 2/2005 Hidai ..................... 327/291

* cited by examiner

*Primary Examiner* — John Poos  
(74) *Attorney, Agent, or Firm* — Morgan, Lewis & Bockius LLP

(57) ABSTRACT

A gate driving circuit includes a first clock generator to output n output control clock pulses having different phases; a second clock generator to create m*n output clock pulses having different phases and partially overlapped with one another in high periods thereof, to arrange the m*n output clock pulses in sequence of phase, to bind the m*n output clock pulses arranged in sequence of phase in units of n to generate m groups, each of which has n output clock pulses, and to output the m*n output clock pulses so that a rising edge of an output clock pulse having a k-th sequence of phase included in each group is located in a high period of an output control clock pulse having a k-th sequence of phase among the n output control clock pulses; and a shift register sequentially outputting a plurality of scan pulses.

21 Claims, 30 Drawing Sheets (a)

(b)

(a)

(b)

GATE DRIVING CIRCUIT

This application claims the benefit of Korean Patent Application Nos. 10-2011-0015738 filed on Feb. 22, 2011 and 10-2011-0066276 filed on Jul. 5, 2011 which are hereby incorporated by reference as if fully set forth herein.

BACKGROUND OF THE INVENTION

1. Field of the Invention

The present invention relates to a gate driving circuit, and more particularly, to a gate driving circuit in which leakage of charge from a set node is prevented to stabilize an output from a stage.

2. Discussion of the Related Art

A shift register outputs a plurality of scan pulses in order to sequentially drive gate lines of a display device, such as a liquid crystal display. To this end, the shift register includes a plurality of switching devices. An oxide semiconductor transistor may be employed as such a switching device.

FIG. 1 is a view illustrating relational characteristics between a gate voltage and drain current of a conventional oxide semiconductor transistor based on temperature.

For an N-type oxide semiconductor transistor used in a shift register, a threshold voltage thereof preferably has a positive value. However, as temperature increases, the threshold voltage of the oxide semiconductor transistor moves negatively, as shown in FIG. 1. For this reason, the N-type oxide semiconductor transistor, which has to be turned off in an output period of the shift register, may not be normally turned off at a high temperature, thereby generating leakage current. This leakage current may lower a voltage at a set node, resulting in a problem that the output of the shift register is not normally generated.

FIG. 2 is a view illustrating a voltage at a set node and a voltage of a scan pulse based on variation in a threshold voltage of a conventional oxide semiconductor transistor.

As can be seen from FIG. 2(a), when the threshold voltage Vth of the oxide semiconductor transistor is −1, the voltage Vq at the set node rapidly falls due to leakage current of the oxide semiconductor transistor, such that the voltage Vsp of the scan pulse, which is an output of a shift register, rapidly falls too.

Also, as can be seen from FIG. 2(b), when the threshold voltage Vth of the oxide semiconductor transistor is −3, the leakage current of the oxide semiconductor transistor further increases, such that the voltage Vq at the set node cannot rise, thereby causing the voltage Vsp of scan pulse not to be generated at all.

SUMMARY OF THE INVENTION

Accordingly, the present invention is directed to a gate driving circuit that substantially obviates one or more problems due to limitations and disadvantages of the related art.

An object of the present invention is to provide a gate driving circuit in which a clock pulse supplied to a pull-up switching device which is in charge of output and clock pulses supplied to switching devices which are in charge of charging/discharging a set node have different waveforms, thereby preventing current leakage from the set node.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a gate driving circuit includes a first clock generator to output n (n being a natural number equal to or greater than 2) output control clock pulses having different phases; a second clock generator to create m*n (m being a natural number) output clock pulses having different phases and partially overlapped with one another in high periods thereof, to arrange the m*n output clock pulses in sequence of phase, to bind the m*n output clock pulses arranged in sequence of phase in units of n to generate m groups, each of which has n output clock pulses, and to output the m*n output clock pulses so that a rising edge of an output clock pulse having a k-th sequence of phase included in each group is located in a high period of an output control clock pulse having a k-th sequence of phase among the n output control clock pulses; and a shift register to receive the n output control clock pulses from the first clock generator and the m*n output clock pulses from the second clock generator and to sequentially output a plurality of scan pulses.

The n output control clock pulses and the m*n output clock pulses each comprise a plurality of impulses which is periodically generated, and a rising edge of an impulse included in an output clock pulse having a k-th sequence of phase and belonging to a j-th (j is natural number equal to or less than m) group is located in a high period of an impulse having a k-th sequence of phase.

the m*n-th output clock pulse further comprises a dummy impulse, and the dummy impulse has the same output timing as a start pulse having a phase preceding that of a first output clock pulse.

Voltage of each of the n output control clock pulses in a low period thereof is lower than or equal to voltage of each of the m*n output clock pulses in a low period thereof.

Each of the m*n output clock pulses does not overlap with at least one of the n output control clock pulses.

The shift register comprises a plurality of stages to sequentially output scan pulses, each of the stages outputs a scan pulse through an output terminal thereof, the n output control clock pulses are transferred through n output control clock lines, the m*n output clock pulses are transferred through m*n output clock lines, a p-th (p being a natural number) stage comprises: a first switching device turned on or off according to any one of the n output control clock pulses, and interconnecting an output terminal of a (p−q)-th (q being a natural number less than p) stage or a start transfer line transferring a start pulse and a set node when turned on; a second switching device turned on or off according to any one of the n output control clock pulses, and interconnecting the set node and a first discharging voltage line transferring a first discharging voltage when turned on; and a pull-up switching device turned on or off according to voltage applied to the set node, and interconnecting any one of the output clock lines and an output terminal of the p-th stage when turned on, a high period of the output clock pulse does not overlap with a high period of the output control clock pulse supplied to the second switching device, voltage of each of the n output control clock pulses in the low period thereof is lower than or equal to the first discharging voltage, a high period of the output clock pulse supplied to the (p−q)-th stage partially overlaps with a high period of the output clock pulse supplied to the p-th stage, and a rising edge of the output clock pulse supplied to the pull-up switching device is located in a high period of the output control clock pulse supplied to the first switching device.

q may be 1 or 2.

The p-th stage further comprises: a third switching device turned on or off according to an output clock pulse from any one of the output clock lines, and interconnecting a charging voltage line transferring a charging voltage and a reset node when turned on; a fourth switching device turned on or off according to voltage applied to the set node, and interconnecting the reset node and a second discharging voltage line transferring a second discharging voltage when turned on; and a pull-down switching device turned on or off according to voltage applied to the reset node, and interconnecting the output terminal of the p-th stage and a third discharging voltage line transferring a third discharging voltage when turned on, the pull-up switching device and the third switching device being supplied with the same output clock pulse.

The p-th stage further comprises at least one selected from among: a fifth switching device turned on or off according to a scan pulse from a (p+r)-th (r being a natural number) stage, and interconnecting the set node and the first discharging voltage line when turned on; a sixth switching device turned on or off according to voltage applied to the output terminal of the p-th stage, and interconnecting the reset node and the second discharging voltage line when turned on; a seventh switching device turned on or off according to the scan pulse from the (p+r)-th stage, and interconnecting the output terminal of the p-th stage and the third discharging voltage line when turned on; and an eighth switching device turned on or off according to a scan pulse from a (p−s)-th (s being a natural number) stage, and interconnecting the charging voltage line and the set node when turned on.

Voltage of each of the m*n output clock pulses in a high period thereof is higher than equal to voltage of each of the n output control clock pulses in a high period thereof.

The p-th stage further comprises: a third switching device turned on or off according to an output clock pulse from any one of the output clock lines, and interconnecting a charging voltage line transferring a charging voltage and a common node when turned on; a fourth switching device turned on or off according to voltage applied to the set node, and interconnecting the common node and a second discharging voltage line transferring a second discharging voltage when turned on; a fifth switching device turned on or off according to voltage applied to the common node, and interconnecting the charging voltage line and a reset node when turned on; a sixth switching device turned on or off according to voltage applied to the set node, and interconnecting the reset node and the second discharging voltage line when turned on; and a pull-down switching device turned on or off according to voltage applied to the reset node, and interconnecting the output terminal of the p-th stage and a third discharging voltage line transferring a third discharging voltage when turned on, the pull-up switching device and the third switching device being supplied with the same output clock pulse.

The p-th stage further comprises: a third switching device turned on or off according to a scan pulse from a (p−r)-th stage, and interconnecting the set node and a charging voltage line transferring a charging voltage when turned on; a fourth switching device turned on or off according to voltage applied to the set node, and interconnecting the reset node and a second discharging voltage line transferring a second discharging voltage when turned on; a pull-down switching device turned on or off according to voltage applied to the reset node, and interconnecting the output terminal of the p-th stage and a third discharging voltage line transferring a third discharging voltage when turned on; and a capacitor connected between the output clock line connected to the pull-up switching device and the reset node.

The p-th stage further comprises: a third switching device turned on or off according to a scan pulse from a (p−s)-th stage, and interconnecting the set node and a charging voltage line transferring a charging voltage when turned on; a fourth switching device turned on or off according to an output clock pulse from any one of the output clock lines, and interconnecting a charging voltage line transferring a charging voltage and a reset node when turned on; a fifth switching device turned on or off according to voltage applied to the set node, and interconnecting the reset node and a second discharging voltage line transferring a second discharging voltage when turned on; and a pull-down switching device turned on or off according to voltage applied to the reset node, and interconnecting the output terminal of the p-th stage and a third discharging voltage line transferring a third discharging voltage when turned on the fourth switching device and the pull-up switching device being supplied with the same output clock pulse.

The p-th stage further comprises: a third switching device turned on or off according to voltage applied to the output terminal of the p-th stage, and interconnecting a reset node and a second discharging voltage line transferring a second discharging voltage when turned on; a fourth switching device turned on or off according to an output clock pulse from any one of the output clock lines, and interconnecting a charging voltage line transferring a charging voltage and the reset node when turned on; a fifth switching device turned on or off according to voltage applied to the set node, and interconnecting the reset node and the second discharging voltage line when turned on; and a pull-down switching device turned on or off according to voltage applied to the reset node, and interconnecting the output terminal of the p-th stage and a third discharging voltage line transferring a third discharging voltage when turned on, the fourth switching device and the pull-up switching device being supplied with the same output clock pulse.

The p-th stage further comprises: a third switching device turned on according to a charging voltage from a charging voltage line to interconnect the charging voltage line and a reset node; a fourth switching device turned on or off according to an output clock pulse from any one of the output clock lines, and interconnecting the reset node and a second discharging voltage line transferring a second discharging voltage when turned on; and a pull-down switching device turned on or off according to voltage applied to the reset node, and interconnecting the output terminal of the p-th stage and a third discharging voltage line transferring a third discharging voltage when turned on, the fourth switching device and the pull-up switching device being supplied with the same output clock pulse.

The p-th stage further comprises: a third switching device turned on according to a charging voltage from a charging voltage line to interconnect the charging voltage line and a reset node; a fourth switching device turned on or off according to an output clock pulse from any one of the output clock lines, and interconnecting the reset node and a second discharging voltage line transferring a second discharging voltage when turned on; a fifth switching device turned on or off according to voltage applied to the set node, and interconnecting the reset node and the second discharging voltage line when turned on; and a pull-down switching device turned on or off according to voltage applied to the reset node, and interconnecting the output terminal of the p-th stage and a third discharging voltage line transferring a third discharging voltage when turned on, the fourth switching device and the second switching device being supplied with the same output clock pulse.

High periods of the n output control clock pulses may not overlap with one another.

At least two of the first to third discharging voltages may be the same.

The shift register comprises a plurality of stages to sequentially output scan pulses, each of the stages outputs a scan pulse through an output terminal thereof, the n output control clock pulses are transferred through n output control clock lines, the m*n output clock pulses are transferred through m*n output clock lines, a p-th (p being a natural number) stage comprises: a first switching device turned on or off according to any one of the n output control clock pulses, and interconnecting an output terminal of a (p−q)-th (q being a natural number less than p) stage or a start transfer line transferring a start pulse and a set node when turned on; a pull-up switching device turned on or off according to voltage applied to the set node, and interconnecting any one of the output clock lines and an output terminal of the p-th stage when turned on; a third switching device turned on or off according to an output clock pulse from any one of the output clock lines, and interconnecting a charging voltage line transferring a charging voltage and a reset node when turned on; a fourth switching device turned on or off according to voltage applied to the set node, and interconnecting the reset node and a second discharging voltage line transferring a second discharging voltage when turned on; and a pull-down switching device turned on or off according to voltage applied to the reset node, and interconnecting the output terminal of the p-th stage and a third discharging voltage line transferring a third discharging voltage when turned on, the pull-up switching device and the third switching device are supplied with the same output clock pulse, voltage of each of the n output control clock pulses in a low period thereof is lower than or equal to the second and third discharging voltages, a high period of the output clock pulse supplied to the (p−q)-th stage partially overlaps with a high period of the output clock pulse supplied to the p-th stage, and a rising edge of the output clock pulse supplied to the pull-up switching device is located in a high period of the output control clock pulse supplied to the first switching device.

The shift register comprises a plurality of stages to sequentially output scan pulses, each of the stages outputs a scan pulse through an output terminal thereof, the n output control clock pulses are transferred through n output control clock lines, the m*n output clock pulses are transferred through m*n output clock lines, a p-th (p being a natural number) stage comprises: a first switching device turned on or off according to any one of the n output control clock pulses, and interconnecting an output terminal of a (p−q)-th (q being a natural number less than p) stage or a start transfer line transferring a start pulse and a set node when turned on; a pull-up switching device turned on or off according to voltage applied to the set node, and interconnecting any one of the output clock lines and an output terminal of the p-th stage when turned on; a third switching device turned on or off according to an output clock pulse from any one of the output clock lines, and interconnecting the output clock line and a reset node when turned on; a fourth switching device turned on or off according to voltage applied to the set node, and interconnecting the reset node and a second discharging voltage line transferring a second discharging voltage when turned on; and a pull-down switching device turned on or off according to voltage applied to the reset node, and interconnecting the output terminal of the p-th stage and a third discharging voltage line transferring a third discharging voltage when turned on, the pull-up switching device and the third switching device are supplied with the same output clock pulse, a high period of the output clock pulse does not overlap with a high period of the output control clock pulse supplied to the first switching device, voltage of each of the n output control clock pulses in a low period thereof is lower than or equal to the second and third discharging voltages, a high period of the output clock pulse supplied to the (p−q)-th stage partially overlaps with a high period of the output clock pulse supplied to the p-th stage, and a rising edge of the output clock pulse supplied to the pull-up switching device is located in a high period of the output control clock pulse supplied to the first switching device.

The shift register comprises a plurality of stages to sequentially output scan pulses, each of the stages outputs a scan pulse through an output terminal thereof, the n output control clock pulses are transferred through n output control clock lines, the m*n output clock pulses are transferred through m*n output clock lines, a p-th (p being a natural number) stage comprises: a first switching device turned on or off according to any one of the n output control clock pulses, and interconnecting an output terminal of a (p−q)-th (q being a natural number less than p) stage or a start transfer line transferring a start pulse and a set node when turned on; a pull-up switching device turned on or off according to voltage applied to the set node, and interconnecting any one of the output clock lines and an output terminal of the p-th stage when turned on; a third switching device turned on according to a charging voltage from a charging voltage line to interconnect any one of the output clock lines and a reset node; a fourth switching device turned on or off according to voltage applied to the set node, and interconnecting the reset node and a second discharging voltage line transferring a second discharging voltage when turned on; and a pull-down switching device turned on or off according to voltage applied to the reset node, and interconnecting the output terminal of the p-th stage and a third discharging voltage line transferring a third discharging voltage when turned on, the pull-up switching device and the third switching device are supplied with the same output clock pulse, a high period of the output clock pulse does not overlap with a high period of the output control clock pulse supplied to the first switching device, voltage of each of the n output control clock pulses in a low period thereof is lower than or equal to the second and third discharging voltages, a high period of the output clock pulse supplied to the (p−q)-th stage partially overlaps with a high period of the output clock pulse supplied to the p-th stage, and a rising edge of the output clock pulse supplied to the pull-up switching device is located in a high period of the output control clock pulse supplied to the first switching device.

The shift register comprises a plurality of stages to sequentially output scan pulses, each of the stages outputs a scan pulse through an output terminal thereof, the n output control clock pulses are transferred through n output control clock lines, the m*n output clock pulses are transferred through m*n output clock lines, a p-th (p being a natural number) stage comprises: a first switching device turned on or off according to any one of the n output control clock pulses, and interconnecting an output terminal of a (p−q)-th (q being a natural number less than p) stage or a start transfer line transferring a start pulse and a set node when turned on; a pull-up switching device turned on or off according to voltage applied to the set node, and interconnecting any one of the output clock lines and an output terminal of the p-th stage when turned on; a third switching device turned on or off according to an output clock pulse from any one of the output clock lines, and interconnecting a charging voltage line transferring a charging voltage and a common node when turned on; a fourth switching device turned on or off according to voltage applied to the set node, and interconnecting the common node and a second discharging voltage line transferring a second discharging voltage when turned on; a fifth switching device turned on or off according to voltage applied to the common node, and interconnecting the charging voltage line and a reset node when turned on; a sixth switching device turned on or off according to voltage applied to the set node, and interconnecting the reset node and the second discharging voltage line when turned on; and a pull-down switching device turned on or off according to voltage applied to the reset node, and interconnecting the output terminal of the p-th stage and a third discharging voltage line transferring a third discharging voltage when turned on, a high period of the output clock pulse does not overlap with a high period of the output control clock pulse supplied to the first switching device, voltage of each of the n output control clock pulses in a low period thereof is lower than the second and third discharging voltages, the pull-up switching device and the third switching device are supplied with the same output clock pulse, a high period of the output clock pulse supplied to the (p–q)-th stage partially overlaps with a high period of the output clock pulse supplied to the p-th stage, and a rising edge of the output clock pulse supplied to the pull-up switching device is located in a high period of the output control clock pulse supplied to the first switching device.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 3:
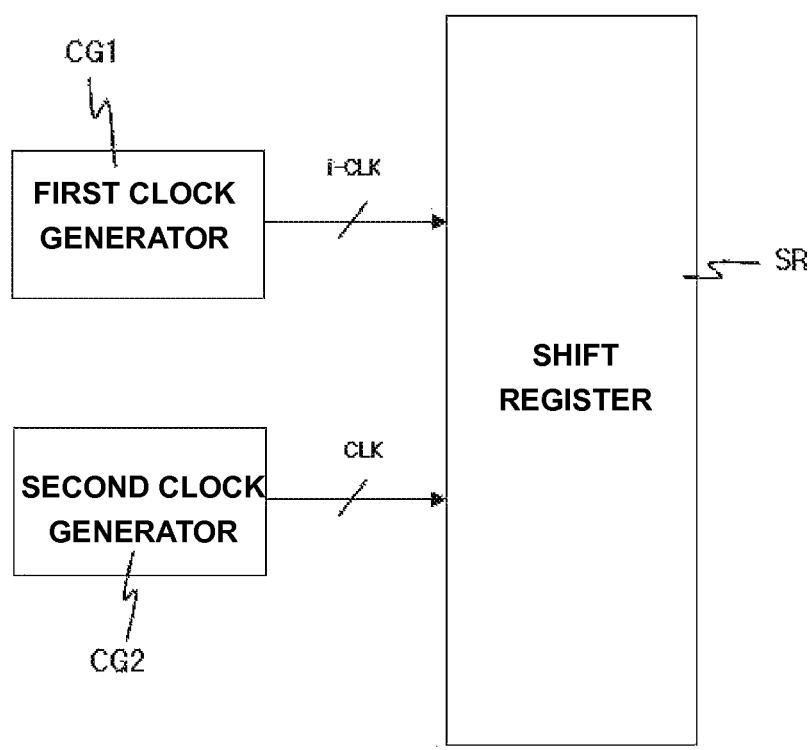
FIG. 3 is a block diagram showing a gate driving circuit according to an embodiment of the present invention.

FIG. 3 is a block diagram showing a gate driving circuit according to an embodiment of the present invention.

As shown in FIG. 3, the gate driving circuit includes a first clock generator CG1, a second clock generator CG2, and a shift register SR.

The first clock generator CG1 outputs n (n being a natural number equal to or greater than 2) output control clock pulses i-CLK having different phases. The n output control clock pulses are transferred through n output control clock lines.

The second clock generator CG2 outputs m*n output clock pulses CLK having different phases. Particularly, the second clock generator CG2 generates m*n (m being a natural number) output clock pulses having different phases and partially overlapped with one another in high period thereof, arranges the m*n output clock pulses in sequence of phase, and binds the m*n output clock pulses arranged in sequence of phase in units of n to generate m groups. Here, each group has n output clock pulses. Also, the second clock generator CG2 outputs the m*n output clock pulses so that a rising edge of an output clock pulse having a k-th sequence of phase included in each group is located in a high period of an output control clock pulse having a k-th sequence of phase among n output control clock pulses. The m*n output clock pulses are transferred through m*n output clock lines.

The n output control clock pulses and the m*n output clock pulses each include a plurality of impulses which is periodically generated. A rising edge of a first impulse included in an output clock pulse having a k-th sequence of phase and belonging to a j-th (j is natural number equal to or less than m) group is located in a high period of an impulse having a k-th sequence of phase.

An m*n-th output clock pulse may further include a dummy impulse. This dummy impulse has the same output timing as a start pulse having a phase preceding a phase of a first output clock pulse.

Voltage of each of the n output control clock pulses in a low period thereof is lower than voltage of each of the m*n output clock pulses in a low period thereof.

Each of the m*n output clock pulses does not overlap with at least one of the n output control clock pulses.

The shift register SR receives the n output control clock pulses from the first clock generator CG1 and the m*n output clock pulses from the second clock generator CG2 to sequentially output h (h being a natural number equal to or greater than 2) scan pulses.

The output control clock pulses output from the first clock generator CG1 and the output clock pulses output from the second clock generator CG2 have the following forms.

Figure 4:
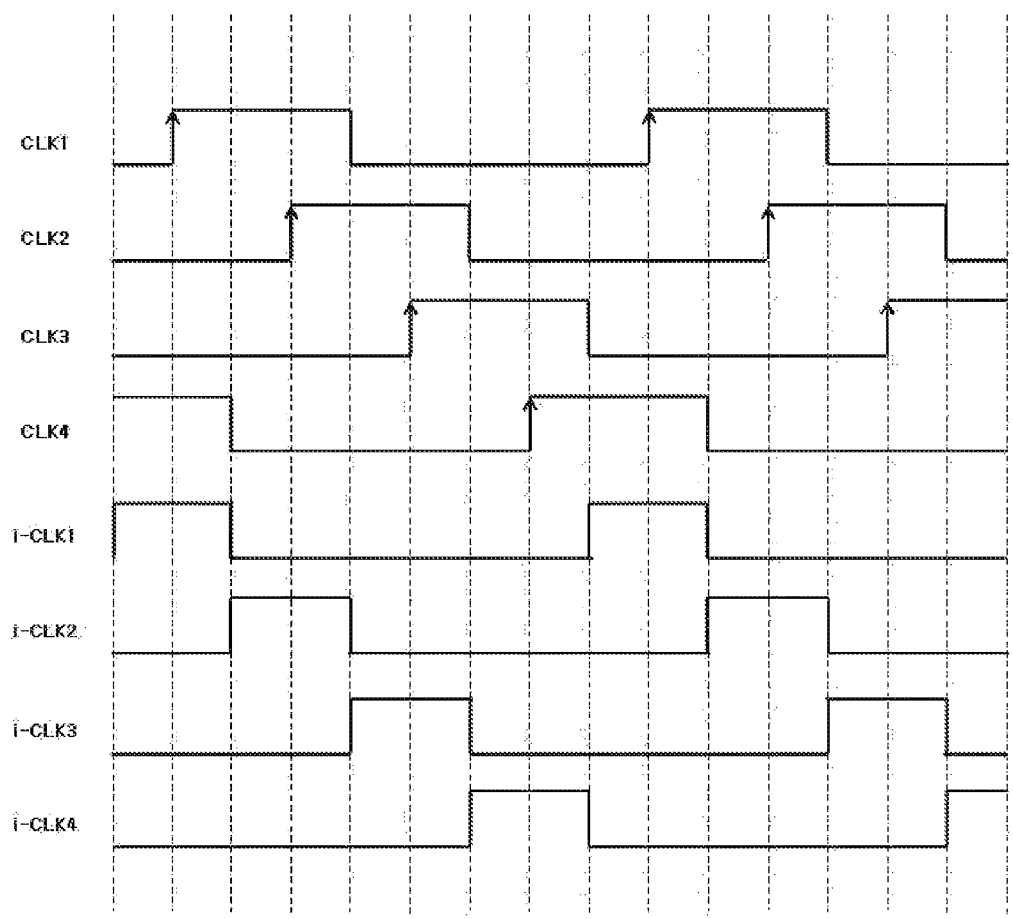
FIG. 4 is a timing diagram of output control clock pulses and output clock pulses according to a first embodiment of the present invention.

FIG. 4 is a timing diagram of output control clock pulses and output clock pulses according to a first embodiment of the present invention.

As shown in FIG. 4, the output control clock pulses include four kinds of output control clock pulses i-CLK1 to i-CLK4 having different phases, and the output clock pulses include four kinds of output clock pulses CLK1 to CLK4 having different phases. That is, FIG. 4 shows waveforms of the output control clock pulses and the output clock pulses when n=4, m=1, and j=1.

As shown in FIG. 4, high periods of the first to fourth output clock pulses CLK1 to CLK4 overlap with one another by ⅓s. The first to fourth output clock pulses CLK1 to CLK4 each include a plurality of impulses which is periodically generated.

The first to fourth output control clock pulses i-CLK1 to i-CLK4 each include a plurality of impulses which is periodically or non-periodically generated. High periods of the first to fourth output control clock pulses i-CLK1 to i-CLK4 may overlap with one another or may not. In FIG. 4, the high periods of the first to fourth output control clock pulses i-CLK1 to i-CLK4 do not overlap with one another. The first to fourth output control clock pulses i-CLK1 to i-CLK4 are transferred through first to fourth output control clock lines.

Voltage of each of the first to fourth output control clock pulses i-CLK1 to i-CLK4 in a low period thereof is lower than or equal to voltage of each of the first to fourth output clock pulses CLK1 to CLK4 in a low period thereof. The first to fourth output clock pulses CLK1 to CLK4 are transferred through first to fourth output clock lines.

As shown in FIG. 4, a rising edge of the first output clock pulse CLK1 is located in a high period of the first output control clock pulse i-CLK1. A rising edge of the second output clock pulse CLK2 is located in a high period of the second output control clock pulse i-CLK2. A rising edge of the third output clock pulse CLK3 is located in a high period of the third output control clock pulse i-CLK3. A rising edge of the fourth output clock pulse CLK4 is located in a high period of the fourth output control clock pulse i-CLK4.

A high period of the first output clock pulse CLK1 overlaps with the first to third output control clock pulses i-CLK1 to i-CLK3 while the high period of the first output clock pulse CLK1 does not overlap with the fourth output control clock pulse i-CLK4. A high period of the second output clock pulse CLK2 overlaps with the second to fourth output control clock pulses i-CLK2 to i-CLK4 while the high period of the second output clock pulse CLK2 does not overlap with the first output control clock pulse i-CLK1. A high period of the third output clock pulse CLK3 overlaps with the third, fourth and first output control clock pulses i-CLK3, i-CLK4 and i-CLK1 while the high period of the third output clock pulse CLK3 does not overlap with the second output control clock pulse i-CLK2. A high period of the fourth output clock pulse CLK4 overlaps with the fourth, first and second output control clock pulses i-CLK4, i-CLK1 and i-CLK2 while the high period of the fourth output clock pulse CLK4 does not overlap with the third output control clock pulse i-CLK3.

Upon defining the first output control clock pulse i-CLK1 having the high period including the rising edge of the first output clock pulse CLK1 as a positive iso clock pulse, the fourth output control clock pulse i-CLK4 not overlapping with the high period of the first output clock pulse CLK1 may be defined as a negative iso clock pulse as a counter to the positive iso clock pulse. In FIG. 4, therefore, the first output control clock pulse i-CLK1 and the fourth output control clock pulse i-CLK4 are respectively positive and negative iso clock pulses of the first output clock pulse CLK1. The second output control clock pulse i-CLK2 and the first output control clock pulse i-CLK1 are respectively positive and negative iso clock pulses of the second output clock pulse CLK2. The third output control clock pulse i-CLK3 and the second output control clock pulse i-CLK2 are respectively positive and negative iso clock pulses of the third output clock pulse CLK3. The fourth output control clock pulse i-CLK4 and the third output control clock pulse i-CLK3 are respectively positive and negative iso clock pulses of the fourth output clock pulse CLK4.

Corresponding positive and negative iso clock pulses may overlap with each other or may not. For example, the first output control clock pulse i-CLK1 and the fourth output control clock pulse i-CLK4, which are respectively positive and negative iso clock pulses of the first output clock pulse CLK1, may overlap with each other or may not.

Meanwhile, in FIG. 4, a first one of the impulses included in the fourth output clock pulse CLK4 is a dummy impulse. This dummy impulse is synchronized with a start pulse.

Figure 5:
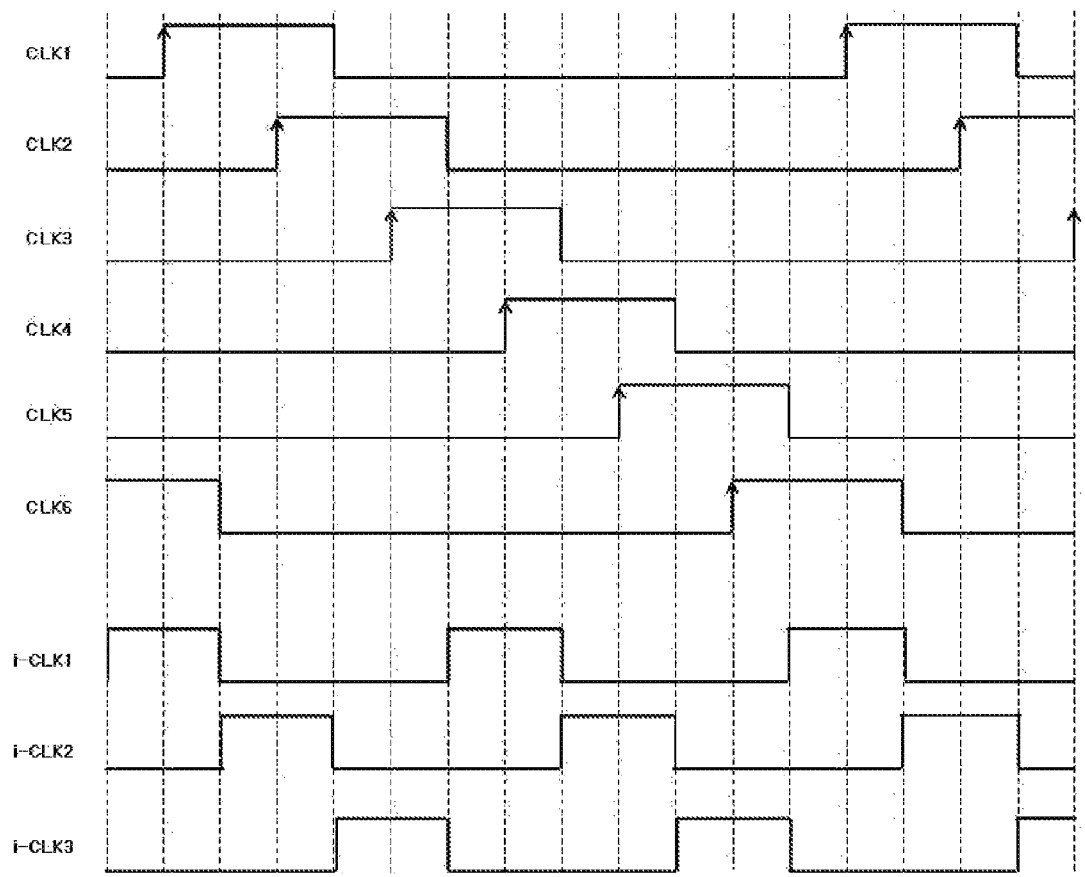
FIG. 5 is a timing diagram of output control clock pulses and output clock pulses according to a second embodiment of the present invention.

FIG. 5 is a timing diagram of output control clock pulses and output clock pulses according to a second embodiment of the present invention.

As shown in FIG. 5, high periods of first to sixth output clock pulses CLK1 to CLK6 overlap with one another by ⅓s. First to sixth output clock pulses CLK1 to CLK6 each include a plurality of impulses which is periodically generated.

The first to third output control clock pulses i-CLK1 to i-CLK3 each include a plurality of impulses which is periodically or non-periodically generated. Also, high periods of the first to third output control clock pulses i-CLK1 to i-CLK3 may overlap with one another or may not. In FIG. 5, the high periods of the first to third output control clock pulses i-CLK1 to i-CLK3 do not overlap with one another.

Voltage (low voltage) of each of the first to third output control clock pulses i-CLK1 to i-CLK3 in a low period thereof is lower than voltage (low voltage) of each of the first to sixth output clock pulses CLK1 to CLK6 in a low period thereof.

As shown in FIG. 5, the output control clock pulses include three kinds of output control clock pulses having different phases, and the output clock pulses include six kinds of output clock pulses having different phases. That is, FIG. 5 shows waveforms of the output control clock pulses and the output clock pulses when n=3, m=2, and j=2.

The output clock pulses and the output control clock pulses may have a relationship of m:1. In FIG. 5, the output clock pulses and the output control clock pulses have a relationship of 2:1.

The first to third output clock pulses constitute a first group, and the fourth to sixth output clock pulses constitute a second group. A rising edge of an output clock pulse having a k-th sequence of phase in each group is located in a high period of an output control clock pulse having a k-th sequence of phase. For example, a rising edge of a first output clock pulse CLK1 having a first sequence of phase in the first group and a rising edge of a fourth output clock pulse CLK4 having a first sequence of phase in the second group are located in a high period of a first output control clock pulse i-CLK1 having a first sequence of phase. Specifically, a rising edge of the first output clock pulse CLK1 is located in a high period of a first impulse of the first output control clock pulse i-CLK1, and a rising edge of the fourth output clock pulse CLK4 is located in a high period of a second impulse of the first output control clock pulse i-CLK1.

In the same manner, rising edges of the first and fifth output clock pulses CLK2 and CLK5 are located in a high period of the second output control clock pulse i-CLK2, and rising edges of the third and sixth output clock pulses CLK3 and CLK6 are located in a high of the third output control clock pulse i-CLK3.

The first to third output control clock pulses i-CLK1 to i-CLK3 of FIG. 5 may be defined as positive and negative iso clock pulses, as previously described.

That is, the first output control clock pulse i-CLK1 and the third output control clock pulse i-CLK3 are respectively positive and negative iso clock pulses of the first and fourth output clock pulses CLK1 and CLK4. The second output control clock pulse i-CLK2 and the first output control clock pulse i-CLK1 are respectively positive and negative iso clock pulses of the second and fifth output clock pulses CLK2 and CLK5. The third output control clock pulse i-CLK3 and the first output control clock pulse i-CLK1 are respectively positive and negative iso clock pulses of the third and sixth output clock pulses CLK3 and CLK6.

Meanwhile, in FIG. 5, a first one of the impulses included in the sixth output clock pulse CLK6 is a dummy impulse. This dummy impulse is synchronized with a start pulse.

Figure 1:
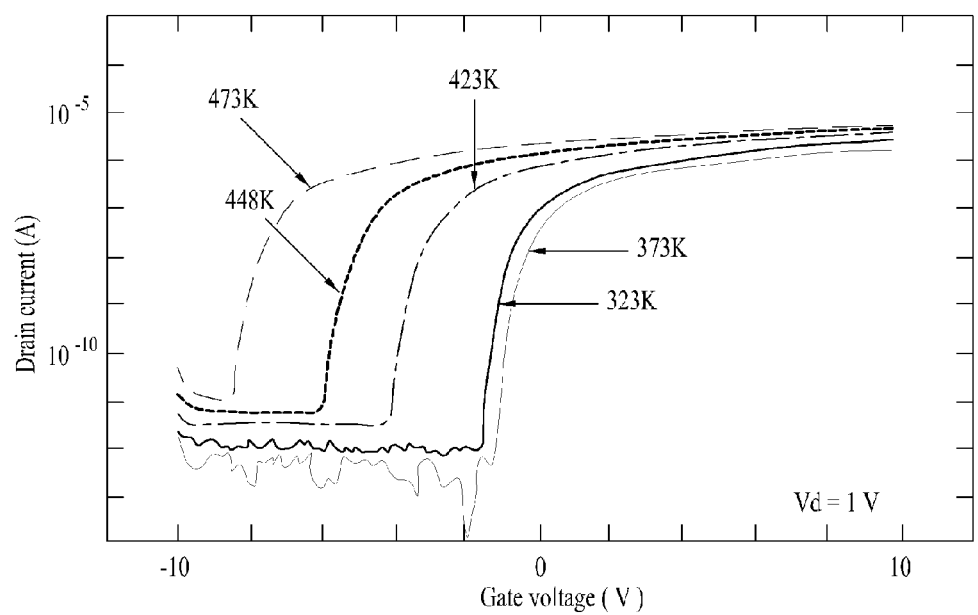
FIG. 1 is a view illustrating relational characteristics between a gate voltage and drain current of a conventional oxide semiconductor transistor based on temperature.
Figure 2:
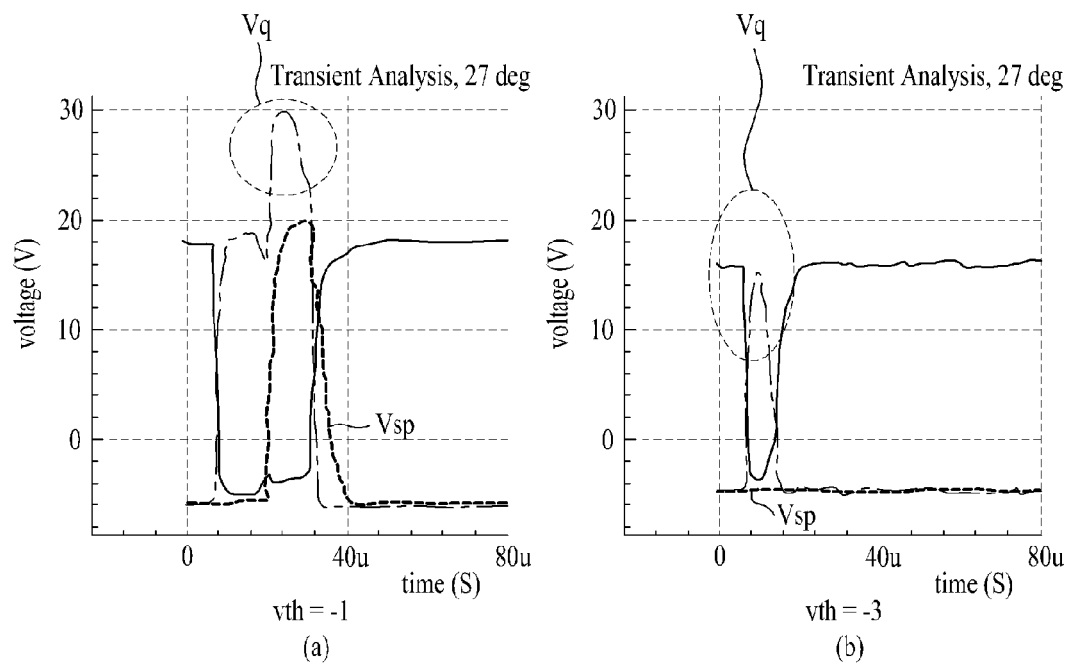
FIG. 2 is a view illustrating a voltage at a set node and a voltage of a scan pulse based on variation in a threshold voltage of a conventional oxide semiconductor transistor.

The output control clock pulses and the output clock pulses shown in FIG. 4 or FIG. 5 may be applied to the shift register of FIG. 1.

Figure 6:
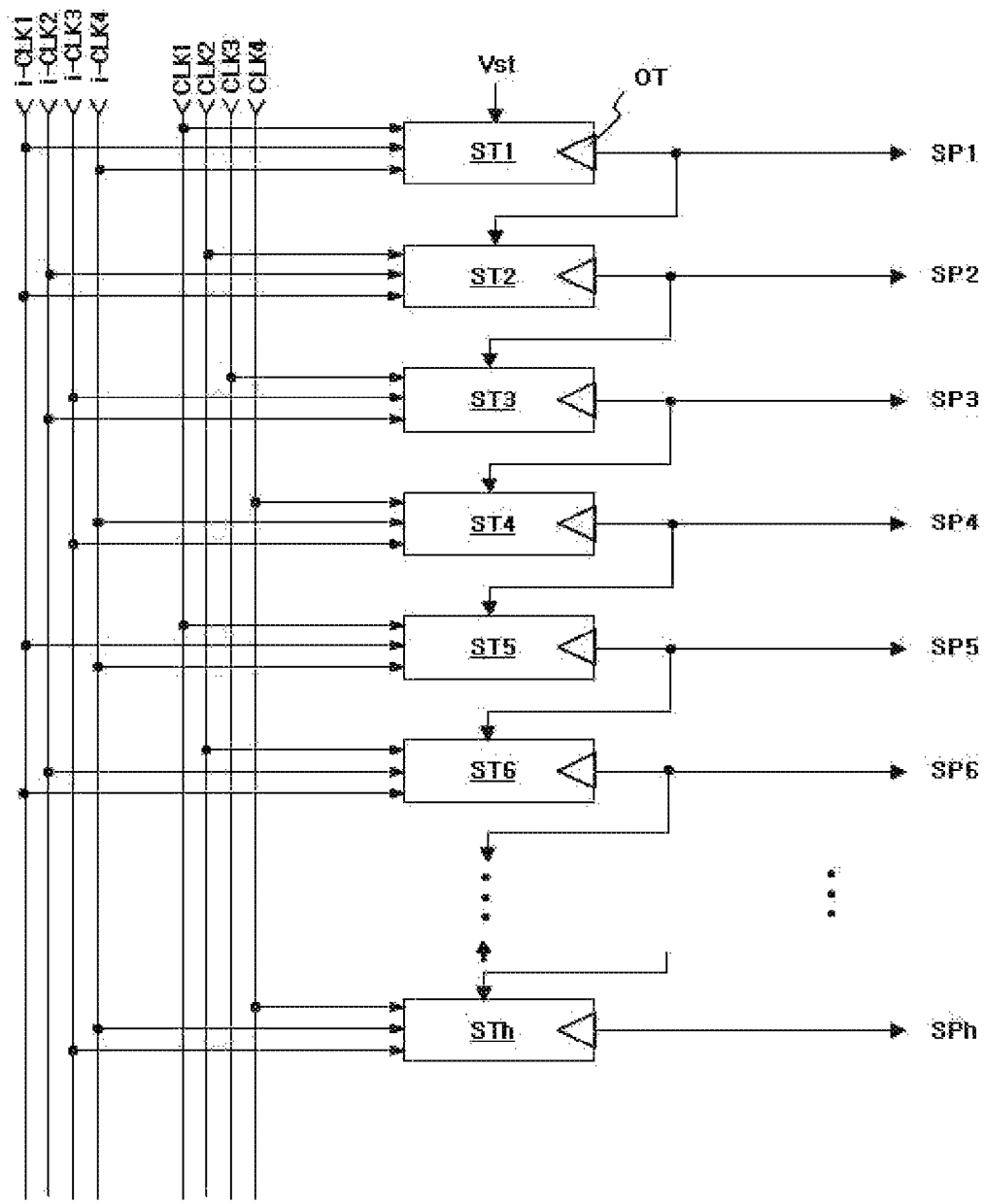
FIG. 6 is a view showing the construction of a shift register of FIG. 1 in detail.

FIG. 6 is a view showing the construction of the shift register SR of FIG. 1 in detail.

As shown in FIG. 6, the shift register SR includes h stages ST1 to STh. Each of the stages ST1 to STh outputs one scan pulse SP1 to SPh for one frame period through an output terminal OT thereof.

Each of the stages ST1 to STh drives a gate line connected thereto using the scan pulse. In addition, each of the stages ST1 to STh controls the operation of a stage downstream therefrom. Also, each of the stages ST1 to STh may control the operation of a stage upstream therefrom as well as the operation of a stage downstream therefrom based on the construction of the shift register. A dummy stage, which supplies a scan pulse to the h-th stage STh, is further provided downstream from the h-th stage STh. Several dummy stages may be provided based on the construction of the shift register.

The stages ST1 to STh output the scan pulses in order from the first stage ST1 to the h-th stage STh. That is, the first stage ST1 outputs the first scan pulse SP1, the second stage ST2 then outputs the second scan pulse SP2, the third stage ST3 then outputs the third scan pulse SP3, . . . , and the h-th stage STh finally outputs the h-th scan pulse SPh.

The scan pulses output from the stages ST1 to STh, excluding the dummy stage, are sequentially supplied to gate lines of a liquid crystal panel (not shown) to sequentially scan the gate lines. Also, the scan pulse output from each of the stages is supplied only to an upstream stage. Or, the scan pulse output from each of the stages may be supplied to the upstream stage and a downstream stage. Alternatively, the scan pulse output from each of the stages may be supplied only to the downstream stage.

This shift register SR may be built in the liquid crystal panel. That is, the liquid crystal panel has a display region to display an image, and a non-display region surrounding the display region, and the shift register is built in the non-display region.

The stages ST1 to STh of the shift register SR, configured in this manner, are supplied with output control clock pulses and output clock pulses mentioned above. In FIG. 6, the first to fourth output control clock pulses i-CLK1 to i-CLK4 and the first to fourth output clock pulses CLK1 to CLK4 shown in FIG. 4 are supplied to the stages.

In FIG. 6, the p-th stage is supplied with a scan pulse from the (p−1)-th stage and a scan pulse from the (p+2)-th stage. Alternatively, the p-th stage may be supplied with a scan pulse from the (p−2)-th stage and a scan pulse from the (p+3)-th stage.

Also, in FIG. 6, the p-th stage is connected to an upstream stage and a downstream stage. Alternatively, the p-th stage may be connected to an upstream stage only.

Hereinafter, the construction of each stage will be described in more detail.

FIGS. 7 to 17 are views showing constructions of stages according to first to eleventh embodiments of the present invention. In each drawing, i-CLKa and i-CLKb indicate corresponding positive and negative iso clock pulses. That is, i-CLKa indicates a positive iso clock pulse of CLKc, and i-CLKb indicates a negative iso clock pulse of CLKc.

A description will be given on the assumption that the first to fourth output control clock pulses i-CLK1 to i-CLK4 and the first to fourth output clock pulses CLK1 to CLK4 shown in FIG. 4 are supplied to the stages of FIGS. 7 to 17.

The construction of a stage according to a first embodiment will be described with reference to FIG. 7.

Figure 7:
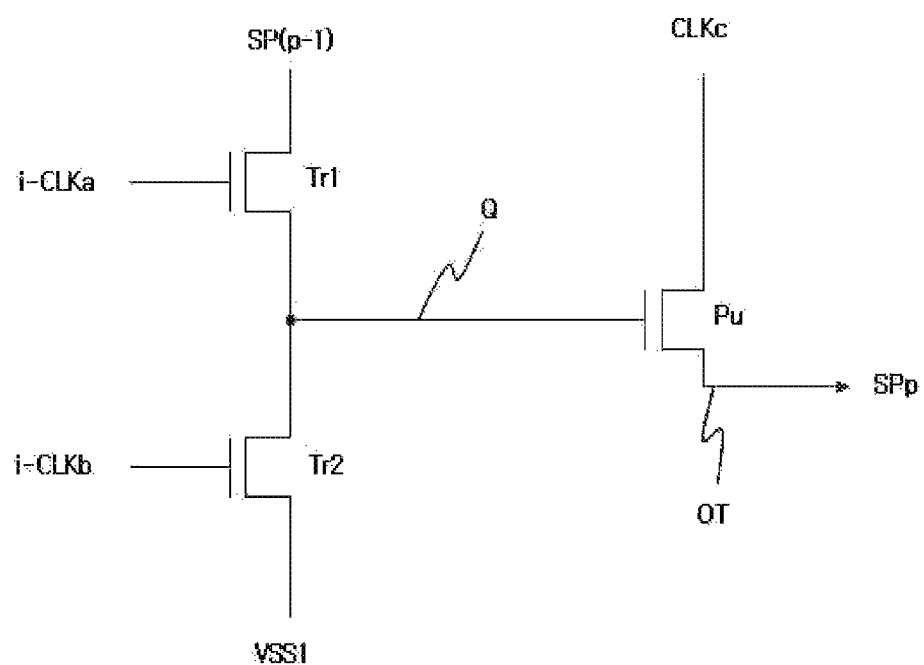
FIGS. 7 to 17 are views showing constructions of stages according to first to eleventh embodiments of the present invention.

As shown in FIG. 7, a p-th stage includes a first switching device Tr1, a second switching device Tr2, and a pull-up switching device Pu.

The first switching device Tr1 included in the p-th stage is turned on or off according to a positive iso clock pulse, and interconnects an output terminal OT of a (p−1)-th stage and a set node Q when turned on. If the p-th stage is a first stage to which a start pulse is supplied, the first switching device Tr1 is connected to a start transfer line instead of the output terminal OT of the (p−1)-th stage. The start pulse is supplied to the start transfer line.

The second switching device Tr2 included in the p-th stage is turned on or off according to a negative iso clock pulse, and interconnects the set node Q and a first discharging voltage line transferring a first discharging voltage VSS1 when turned on.

The pull-up switching device Pu included in the p-th stage is turned on or off according to voltage applied to the set node Q, and interconnects an output clock line and an output terminal OT of the p-th stage when turned on. An output clock pulse CLKc is supplied to the output clock line connected to the pull-up switching device Pu. If CLKc is a first output clock pulse CLK1, i-CLKa and i-CLKb may be a first output control clock pulse i-CLK1 and a fourth output control clock pulse i-CLK4, respectively.

A high period of the output control clock pulse supplied to the first switching device Tr1 may overlap with a high period of the output control clock pulse supplied to the second switching device Tr2. Alternately, the high period of the output control clock pulse supplied to the first switching device Tr1 may not overlap with the high period of the output control clock pulse supplied to the second switching device Tr2.

A high period of an output clock pulse i-CLKa supplied to a (p−q)-th stage may partially overlap with a high period of the output clock pulse i-CLKa supplied to the p-th stage.

The construction of a stage according to a second embodiment will be described with reference to FIG. 8.

Figure 8:
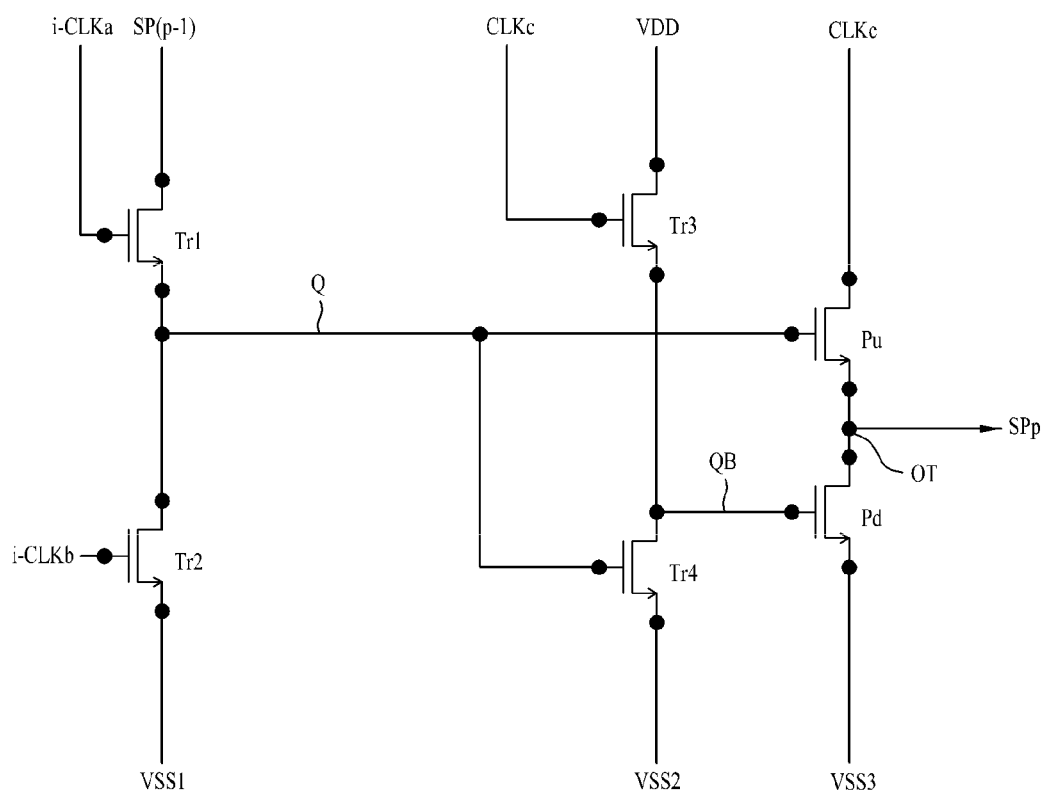

As shown in FIG. 8, a p-th stage includes first to fourth switching devices Tr1 to Tr4, a pull-up switching device Pu, and a pull-down switching device Pd.

The first switching device Tr1 included in the p-th stage is turned on or off according to a positive iso clock pulse, and interconnects an output terminal OT of a (p−1)-th stage and a set node Q when turned on. If the p-th stage is a first stage to which a start pulse is supplied, the first switching device Tr1 is connected to a start transfer line instead of the output terminal OT of the (p−1)-th stage. The start pulse is supplied to the start transfer line.

The second switching device Tr2 included in the p-th stage is turned on or off according to a negative iso clock pulse, and interconnects the set node Q and a first discharging voltage line transferring a first discharging voltage VSS1 when turned on.

The third switching device Tr3 included in the p-th stage is turned on or off according to an output clock pulse from an output clock line, and interconnects a charging voltage line transferring a charging voltage VDD and a reset node QB when turned on.

The fourth switching device Tr4 included in the p-th stage is turned on or off according to voltage applied to the set node Q, and interconnects the reset node QB and a second discharging voltage line transferring a second discharging voltage VSS2 when turned on.

The pull-up switching device Pu included in the p-th stage is turned on or off according to voltage applied to the set node Q, and interconnects an output clock line and an output terminal OT of the p-th stage when turned on. An output clock pulse CLKc is supplied to the output clock line connected to the pull-up switching device Pu. If CLKc is a first output clock pulse CLK1, i-CLKa and i-CLKb may be a first output control clock pulse i-CLK1 and a fourth output control clock pulse i-CLK4, respectively.

The pull-down switching device Pd included in the p-th stage is turned on or off according to voltage applied to the reset node QB, and interconnects the output terminal OT of the p-th stage and a third discharging voltage line transferring a third discharging voltage VSS3 when turned on.

The pull-up switching device Pu and the third switching device Tr3 are supplied with the same output clock pulse. Voltage of each of the output control clock pulses in a low period thereof is lower than or equal to the first discharging voltage VSS1.

The first discharging voltage VSS1 is equal to or different from the second discharging voltage VSS2. In case where the first discharging voltage VSS1 is different from the second discharging voltage VSS2, the first discharging voltage VSS1 is lower or higher than the second discharging voltage VSS2.

Alternatively, the first to third discharging voltages VSS1 to VSS3 may be the same. As another alternative, two of the first to third discharging voltages VSS1 to VSS3 may be the same.

A rising edge of the output clock pulse supplied to the pull-up switching device Pu may be located in a high period of the output control clock pulse supplied to the first switching device Tr1.

The construction of a stage according to a third embodiment will be described with reference to FIG. 9.

Figure 9:
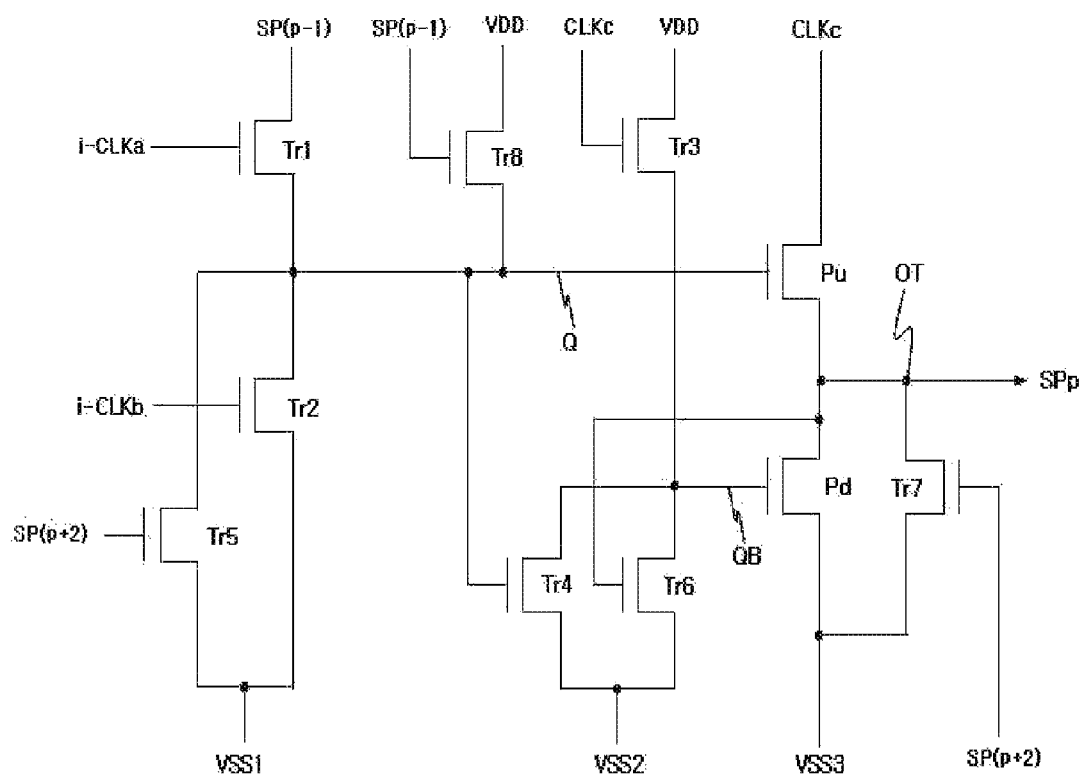

As shown in FIG. 9, a p-th stage includes first to eighth switching devices Tr1 to Tr8, a pull-up switching device Pu, and a pull-down switching device Pd.

The first switching device Tr1 included in the p-th stage is turned on or off according to a positive iso clock pulse, and interconnects an output terminal OT of a (p−1)-th stage and a set node Q when turned on. If the p-th stage is a first stage to which a start pulse is supplied, the first switching device Tr1 is connected to a start transfer line instead of the output terminal OT of the (p−1)-th stage. The start pulse is supplied to the start transfer line.

The second switching device Tr2 included in the p-th stage is turned on or off according to a negative iso clock pulse, and interconnects the set node Q and a first discharging voltage line transferring a first discharging voltage VSS1 when turned on.

The third switching device Tr3 included in the p-th stage is turned on or off according to an output clock pulse from an output clock line, and interconnects a charging voltage line transferring a charging voltage VDD and a reset node QB when turned on. Instead of the output clock pulse, the charging voltage VDD or another output clock pulse (excluding CLKc) may be supplied to the third switching device Tr3.

The fourth switching device Tr4 included in the p-th stage is turned on or off according to voltage applied to the set node Q, and interconnects the reset node QB and a second discharging voltage line transferring a second discharging voltage VSS2 when turned on.

The fifth switching device Tr5 included in the p-th stage is turned on or off according to a scan pulse from a (p+2)-th stage, and interconnects the set node Q and the first discharging voltage line when turned on. The fifth switching device Tr5 may be supplied with a scan pulse from a (p+3)-th stage instead of the scan pulse from the (p+2)-th stage.

The sixth switching device Tr6 included in the p-th stage is turned on or off according to voltage applied to an output terminal OT of the p-th stage, and interconnects the reset node QB and the second discharging voltage line when turned on.

The seventh switching device Tr7 included in the p-th stage is turned on or off according to the scan pulse from the (p+2)-th stage, and interconnects the output terminal OT of the p-th stage and a third discharging voltage line when turned on. The seventh switching device Tr7 may be supplied with the scan pulse from the (p+3)-th stage instead of the scan pulse from the (p+2)-th stage.

The eighth switching device Tr8 included in the p-th stage is turned on or off according to a scan pulse from a (p−1)-th stage, and interconnects the charging voltage line and the set node Q when turned on. If the p-th stage is a first stage to which a start pulse is supplied, the eighth switching device Tr8 is supplied with a start pulse from a start transfer line instead of the (p−1)-th stage.

The pull-up switching device Pu included in the p-th stage is turned on or off according to voltage applied to the set node Q, and interconnects an output clock line and the output terminal OT of the p-th stage when turned on. An output clock pulse CLKc is supplied to the output clock line connected to the pull-up switching device Pu. If CLKc is a first output clock pulse CLK1, i-CLKa and i-CLKb may be a first output control clock pulse i-CLK1 and a fourth output control clock pulse i-CLK4, respectively.

The pull-down switching device Pd included in the p-th stage is turned on or off according to voltage applied to the reset node QB, and interconnects the output terminal OT of the p-th stage and a third discharging voltage line transferring a third discharging voltage VSS3 when turned on.

The first to third discharging voltages VSS1 to VSS3 and the charging voltage VDD are direct current voltages. The first to third discharging voltages VSS1 to VSS3 are set to be lower than the charging voltage VDD. For example, the charging voltage VDD may have a positive value, and the discharging voltages may have a negative value.

The first to third discharging voltages VSS1 to VSS3 may have the same voltage value. Alternatively, at least two of the first to third discharging voltages VSS1 to VSS3 may have different values. In case where the at least two of the first to third discharging voltages VSS1 to VSS3 have different values, the first discharging voltage VSS1 may be highest or lowest, the second discharging voltage VSS2 may be highest or lowest, or the third discharging voltage VSS3 may be highest or lowest. Alternatively, the first discharging voltage VSS1 may be set to be highest, the third discharging voltage VSS3 may be set to be lowest, and the second discharging voltage VSS2 may be set to be between the first discharging voltage VSS1 and the third discharging voltage VSS3. Also, the second discharging voltage VSS2 may be set to be highest, the third discharging voltage VSS3 may be set to be lowest, and the first discharging voltage VSS1 may be set to be between the second discharging voltage VSS2 and the third discharging voltage VSS3. Also, the third discharging voltage VSS3 may be set to be highest, the first discharging voltage VSS1 may be set to be lowest, and the second discharging voltage VSS2 may be set to be between the third discharging voltage VSS3 and the first discharging voltage VSS1. Also, the first discharging voltage VSS1 and the third discharging voltage VSS3 may be set to be the same, and the second discharging voltage VSS2 may be set to be equal to or lower than the third discharging voltage VSS3.

A rising edge of the output clock pulse supplied to the pull-up switching device Pu may be located in a high period of the output control clock pulse supplied to the first switching device Tr1.

Meanwhile, in the third embodiment, the first discharging voltage VSS1 may be replaced by an output clock pulse. In this case, the output clock pulse, which replaces the first discharging voltage VSS1, is the same as the output clock pulse supplied to the supplied to the pull-up switching device Pu.

In the third embodiment, voltage (high voltage) of each of the output control clock pulses i-CLK1 to i-CLK4 in a high period thereof is set to be equal to or lower than voltage (high voltage) of each of the output clock pulses CLK1 to CLK4 in a high period thereof.

Also, the first and second discharging voltages VSS1 and VSS2 may be equal to or lower than voltage of each of the output control clock pulses in a low period thereof.

Meanwhile, at least one of the fifth to eighth switching devices Tr5 to Tr8 may be removed from the structure of the third embodiment.

The construction of a stage according to a fourth embodiment will be described with reference to FIG. 10.

Figure 10:
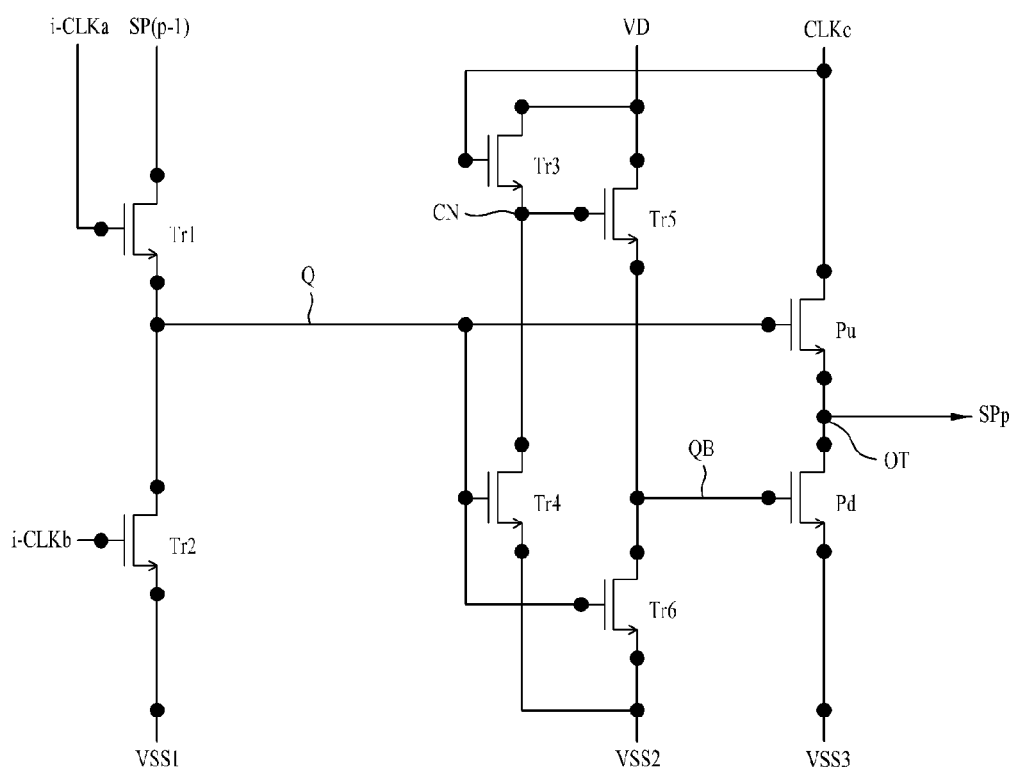

As shown in FIG. 10, a p-th stage includes first to sixth switching devices Tr1 to Tr6, a pull-up switching device Pu, and a pull-down switching device Pd.

The first switching device Tr1 included in the p-th stage is turned on or off according to a positive iso clock pulse, and interconnects an output terminal OT of a (p−1)-th stage and a set node Q when turned on. If the p-th stage is a first stage to which a start pulse is supplied, the first switching device Tr1 is connected to a start transfer line instead of the output terminal OT of the (p−1)-th stage. The start pulse is supplied to the start transfer line.

The second switching device Tr2 included in the p-th stage is turned on or off according to a negative iso clock pulse, and interconnects the set node Q and a first discharging voltage line transferring a first discharging voltage VSS1 when turned on.

The third switching device Tr3 included in the p-th stage is turned on or off according to an output clock pulse from an output clock line, and interconnects a charging voltage line transferring a charging voltage VDD and a common node CN when turned on.

The fourth switching device Tr4 included in the p-th stage is turned on or off according to voltage applied to the set node Q, and interconnects the common node CN and a second discharging voltage line transferring a second discharging voltage VSS2 when turned on.

The fifth switching device Tr5 included in the p-th stage is turned on or off according to voltage applied to the common node CN, and interconnects the charging voltage line and a reset node QB when turned on.

The sixth switching device Tr6 included in the p-th stage is turned on or off according to voltage applied to the set node Q, and interconnects the reset node QB and the second discharging voltage line when turned on.

The pull-up switching device Pu included in the p-th stage is turned on or off according to voltage applied to the set node Q, and interconnects an output clock line and an output terminal OT of the p-th stage when turned on. An output clock pulse CLKc is supplied to the output clock line connected to the pull-up switching device Pu. If CLKc is a first output clock pulse CLK1, i-CLKa and i-CLKb may be a first output control clock pulse i-CLK1 and a fourth output control clock pulse i-CLK4, respectively.

The pull-down switching device Pd included in the p-th stage is turned on or off according to voltage applied to the reset node QB, and interconnects the output terminal OT of the p-th stage and a third discharging voltage line transferring a third discharging voltage VSS3 when turned on.

The first to third discharging voltages of the fourth embodiment may have the same properties as those of the third embodiment.

A rising edge of the output clock pulse supplied to the pull-up switching device Pu may be located in a high period of the output control clock pulse supplied to the first switching device Tr1.

The construction of a stage according to a fifth embodiment will be described with reference to FIG. 11.

Figure 11:
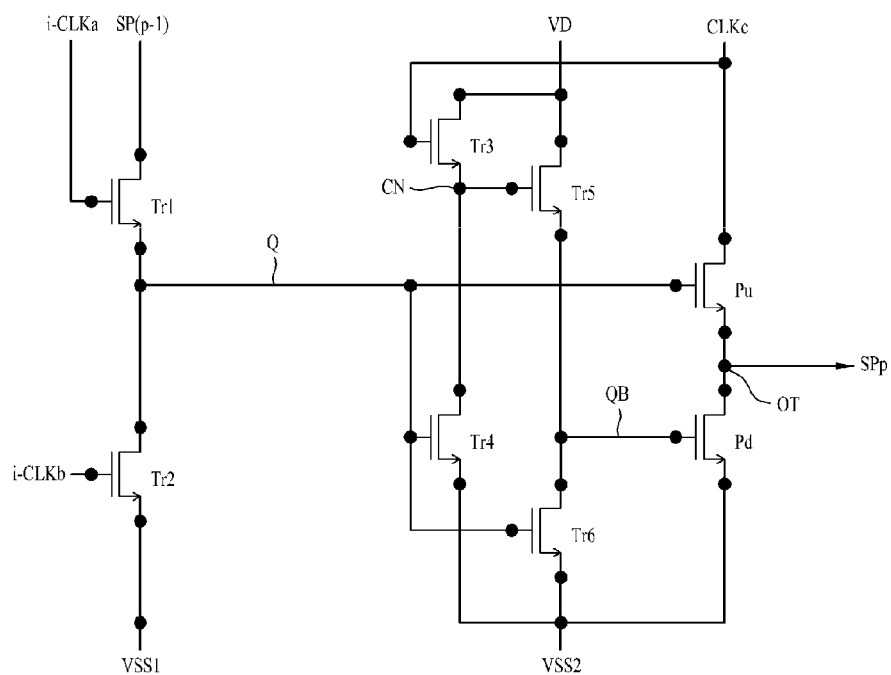

As shown in FIG. 11, a p-th stage includes first to sixth switching devices Tr1 to Tr6, a pull-up switching device Pu, and a pull-down switching device Pd.

The stage of the fifth embodiment is identical to that of the fourth embodiment except that second discharging voltage VSS2 and third discharging voltage VSS3 are the same. That is, as shown in FIG. 11, first and second discharging voltages VSS1 and VSS2 are applied.

The first and second discharging voltages VSS1 and VSS2 may have the same properties as those of the second embodiment. Alternatively, the first and second discharging voltages VSS1 and VSS2 may have the same properties as those of the third embodiment.

The construction of a stage according to a sixth embodiment will be described with reference to FIG. 12.

Figure 12:
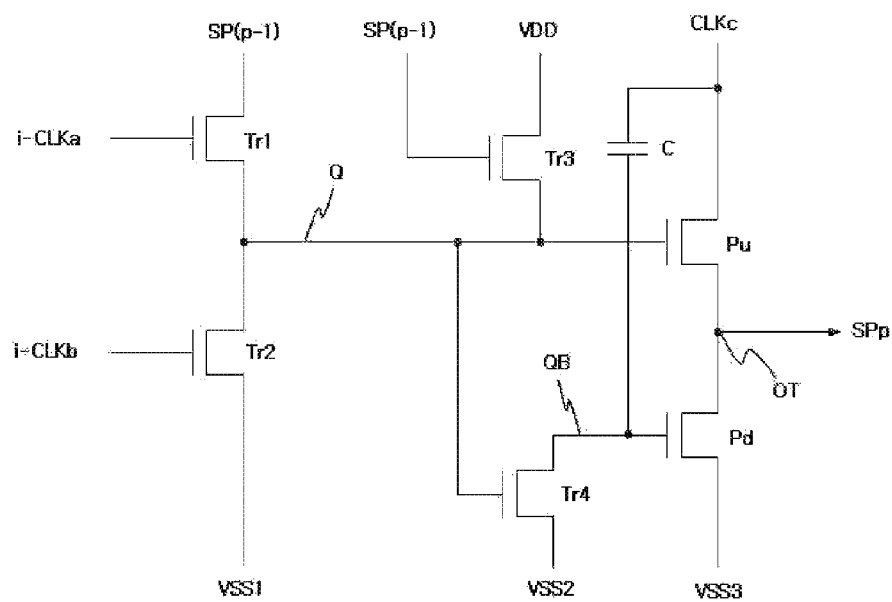

As shown in FIG. 12, a p-th stage includes first to fourth switching devices Tr1 to Tr4, a pull-up switching device Pu, a pull-down switching device Pd, and a capacitor C.

The first switching device Tr1 included in the p-th stage is turned on or off according to a positive iso clock pulse, and interconnects an output terminal OT of a (p−1)-th stage and a set node Q when turned on. If the p-th stage is a first stage to which a start pulse is supplied, the first switching device Tr1 is connected to a start transfer line instead of the output terminal OT of the (p−1)-th stage. The start pulse is supplied to the start transfer line.

The second switching device Tr2 included in the p-th stage is turned on or off according to a negative iso clock pulse, and interconnects the set node Q and a first discharging voltage line transferring a first discharging voltage VSS1 when turned on.

The third switching device Tr3 included in the p-th stage is turned on or off according to a scan pulse from the (p−1)-th stage, and interconnects the set node Q and a charging voltage line transferring a charging voltage VDD when turned on.

The fourth switching device Tr4 included in the p-th stage is turned on or off according to voltage applied to the set node Q, and interconnects the reset node QB and a second discharging voltage line transferring a second discharging voltage VSS2 when turned on.

The pull-up switching device Pu included in the p-th stage is turned on or off according to voltage applied to the set node Q, and interconnects an output clock line and an output terminal OT of the p-th stage when turned on. An output clock pulse CLKc is supplied to the output clock line connected to the pull-up switching device Pu. If CLKc is a first output clock pulse CLK1, i-CLKa and i-CLKb may be a first output control clock pulse i-CLK1 and a fourth output control clock pulse i-CLK4, respectively.

The pull-down switching device Pd included in the p-th stage is turned on or off according to voltage applied to the reset node QB, and interconnects the output terminal OT of the p-th stage and a third discharging voltage line transferring a third discharging voltage VSS3 when turned on.

The capacitor C is connected between the output clock line connected to the pull-up switching device Pu and the reset node QB.

The first to third discharging voltages VSS1 to VSS3 of the sixth embodiment may have the same properties as those of the third embodiment.

Meanwhile, in the sixth embodiment, the first discharging voltage VSS1 may be replaced by an output clock pulse. In this case, the output clock pulse, which replaces the first discharging voltage VSS1, is the same as the output clock pulse supplied to the pull-up switching device Pu.

In the sixth embodiment, voltage of each of the output control clock pulses in a high period thereof is set to be equal to or lower than voltage of each of the output clock pulses in a high period thereof.

Also, the third discharging voltage VSS may be equal to or lower than voltage of each of the output control clock pulses in a low period thereof.

A rising edge of the output clock pulse supplied to the pull-up switching device Pu may be located in a high period of the output control clock pulse supplied to the first switching device Tr1.

The construction of a stage according to a seventh embodiment will be described with reference to FIG. 13.

Figure 13:
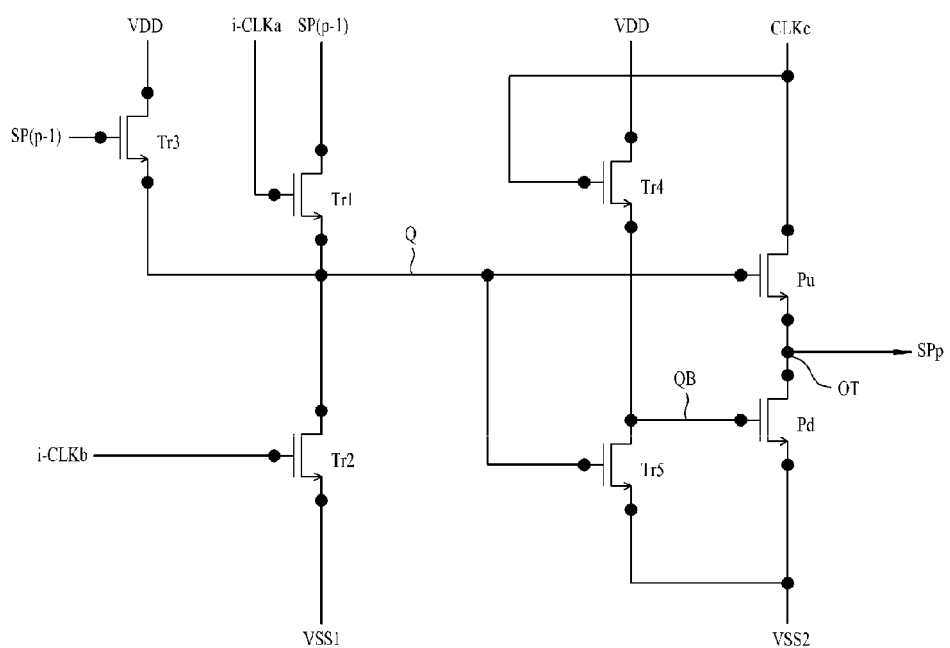

As shown in FIG. 13, a p-th stage includes first to fifth switching devices Tr1 to Tr5, a pull-up switching device Pu, and a pull-down switching device Pd.

The first switching device Tr1 included in the p-th stage is turned on or off according to a positive iso clock pulse, and interconnects an output terminal OT of a (p−1)-th stage and a set node Q when turned on. If the p-th stage is a first stage to which a start pulse is supplied, the first switching device Tr1 is connected to a start transfer line instead of the output terminal OT of the (p−1)-th stage. The start pulse is supplied to the start transfer line.

The second switching device Tr2 included in the p-th stage is turned on or off according to a negative iso clock pulse, and interconnects the set node Q and a first discharging voltage line transferring a first discharging voltage VSS1 when turned on.

The third switching device Tr3 included in the p-th stage is turned on or off according to a scan pulse from the (p−1)-th stage, and interconnects the set node Q and a charging voltage line transferring a charging voltage VDD when turned on.

The fourth switching device Tr4 included in the p-th stage is turned on or off according to an output clock pulse from an output clock line, and interconnects the charging voltage line and a reset node QB when turned on.

The fifth switching device Tr5 included in the p-th stage is turned on or off according to voltage applied to the set node Q, and interconnects the reset node QB and a second discharging voltage line transferring a second discharging voltage VSS2 when turned on.

The pull-up switching device Pu included in the p-th stage is turned on or off according to voltage applied to the set node Q, and interconnects an output clock line and an output terminal OT of the p-th stage when turned on. An output clock pulse CLKc is supplied to the output clock line connected to the pull-up switching device Pu. If CLKc is a first output clock pulse CLK1, i-CLKa and i-CLKb may be a first output control clock pulse i-CLK1 and a fourth output control clock pulse i-CLK4, respectively.

The pull-down switching device Pd included in the p-th stage is turned on or off according to voltage applied to the reset node QB, and interconnects the output terminal OT of the p-th stage and the second discharging voltage line when turned on. The pull-down switching device Pd may be connected to the third discharging voltage line instead of the second discharging voltage line. In this case, the first to third discharging voltages VSS1 to VSS3 may have the same properties as those of the third embodiment.

The fourth switching device Tr4 and the pull-up switching device Pu are supplied with the same output clock pulse.

The first and second discharging voltages VSS1 and VSS2 may have the same properties as those of the second embodiment. Alternatively, the first and second discharging voltages VSS1 and VSS2 may have the same properties as those of the third embodiment.

A rising edge of the output clock pulse supplied to the pull-up switching device Pu may be located in a high period of the output control clock pulse supplied to the first switching device Tr1.

The construction of a stage according to an eighth embodiment will be described with reference to FIG. 14.

Figure 14:
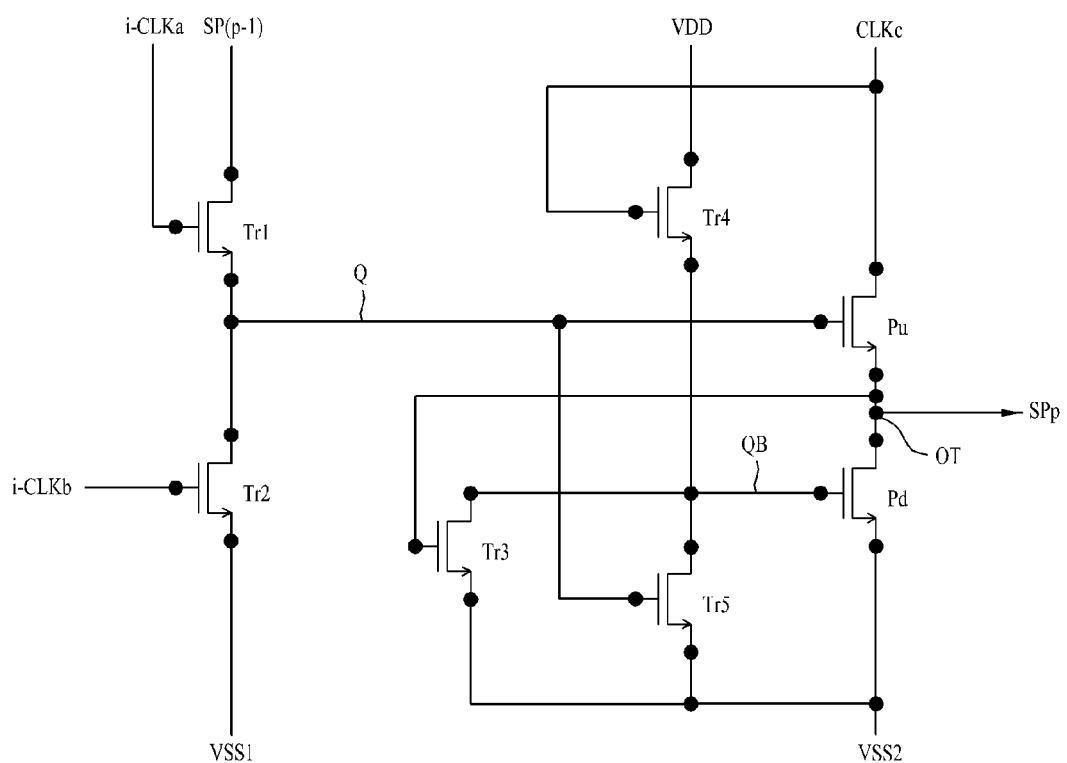

As shown in FIG. 14, a p-th stage includes first to fifth switching devices Tr1 to Tr5, a pull-up switching device Pu, and a pull-down switching device Pd.

The first switching device Tr1 included in the p-th stage is turned on or off according to a positive iso clock pulse, and interconnects an output terminal OT of a (p−1)-th stage and a set node Q when turned on. If the p-th stage is a first stage to which a start pulse is supplied, the first switching device Tr1 is connected to a start transfer line instead of the output terminal OT of the (p−1)-th stage. The start pulse is supplied to the start transfer line.

The second switching device Tr2 included in the p-th stage is turned on or off according to a negative iso clock pulse, and interconnects the set node Q and a first discharging voltage line transferring a first discharging voltage VSS1 when turned on.

The third switching device Tr3 included in the p-th stage is turned on or off according to voltage applied to an output terminal OT of the p-th stage, and interconnects a reset node QB and a second discharging voltage line transferring a second discharging voltage VSS2 when turned on.

The fourth switching device Tr4 included in the p-th stage is turned on or off according to an output clock pulse from an output clock line, and interconnects a charging voltage line transferring a charging voltage VDD and the reset node QB when turned on.

The fifth switching device Tr5 included in the p-th stage is turned on or off according to voltage applied to the set node Q, and interconnects the reset node QB and the second discharging voltage line when turned on.

The pull-up switching device Pu included in the p-th stage is turned on or off according to voltage applied to the set node Q, and interconnects an output clock line and the output terminal OT of the p-th stage when turned on. An output clock pulse CLKc is supplied to the output clock line connected to the pull-up switching device Pu. If CLKc is a first output clock pulse CLK1, i-CLKa and i-CLKb may be a first output control clock pulse i-CLK1 and a fourth output control clock pulse i-CLK4, respectively.

The pull-down switching device Pd included in the p-th stage is turned on or off according to voltage applied to the reset node QB, and interconnects the output terminal OT of the p-th stage and the second discharging voltage line when turned on. The pull-down switching device Pd may be connected to the third discharging voltage line instead of the second discharging voltage line. In this case, the first to third discharging voltages VSS1 to VSS3 may have the same properties as those of the third embodiment. The fourth switching device Tr4 and the pull-up switching device Pu are supplied with the same output clock pulse.

The first and second discharging voltages VSS1 and VSS2 may have the same properties as those of the second embodiment. Alternatively, the first and second discharging voltages VSS1 and VSS2 may have the same properties as those of the third embodiment.

A rising edge of the output clock pulse supplied to the pull-up switching device Pu may be located in a high period of the output control clock pulse supplied to the first switching device Tr1.

The construction of a stage according to a ninth embodiment will be described with reference to FIG. 15.

Figure 15:
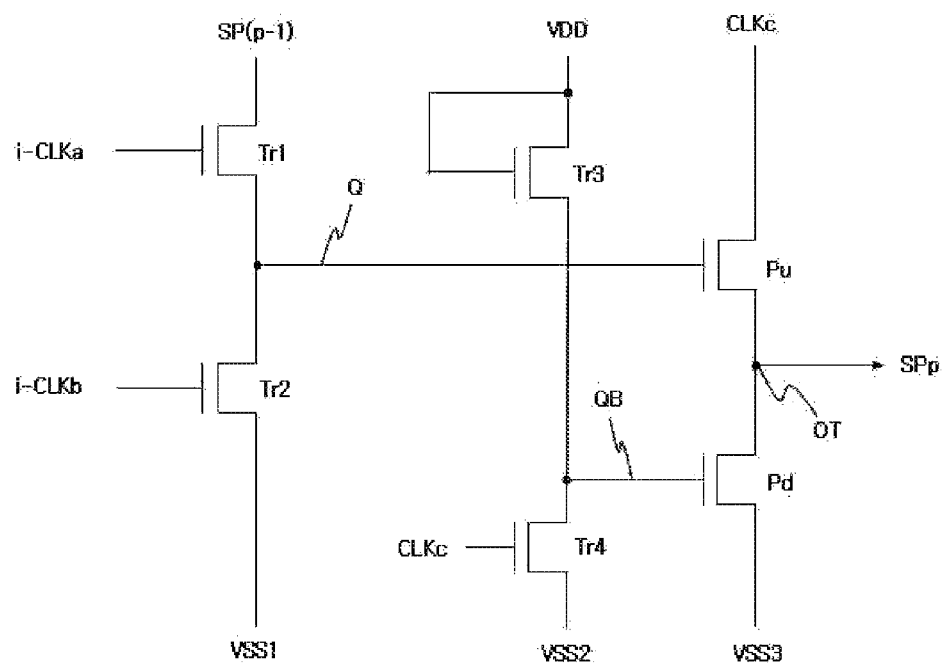

As shown in FIG. 15, a p-th stage includes first to fourth switching devices Tr1 to Tr4, a pull-up switching device Pu, and a pull-down switching device Pd.

The first switching device Tr1 included in the p-th stage is turned on or off according to a positive iso clock pulse, and interconnects an output terminal OT of a (p−1)-th stage and a set node Q when turned on. If the p-th stage is a first stage to which a start pulse is supplied, the first switching device Tr1 is connected to a start transfer line instead of the output terminal OT of the (p−1)-th stage. The start pulse is supplied to the start transfer line.

The second switching device Tr2 included in the p-th stage is turned on or off according to a negative iso clock pulse, and interconnects the set node Q and a first discharging voltage line transferring a first discharging voltage VSS1 when turned on.

The third switching device Tr3 included in the p-th stage is turned on according to a charging voltage VDD from a charging voltage line, and interconnects the charging voltage line and a reset node QB.

The fourth switching device Tr4 included in the p-th stage is turned on or off according to an output clock pulse from an output clock line, and interconnects the reset node QB and a second discharging voltage line when turned on. Here, the second discharging voltage line transfers a second discharging voltage VSS2.

The pull-up switching device Pu included in the p-th stage is turned on or off according to voltage applied to the set node Q, and interconnects an output clock line and an output terminal OT of the p-th stage when turned on. An output clock pulse CLKc is supplied to the output clock line connected to the pull-up switching device Pu. If CLKc is a first output clock pulse CLK1, i-CLKa and i-CLKb may be a first output control clock pulse i-CLK1 and a fourth output control clock pulse i-CLK4, respectively.

The pull-down switching device Pd included in the p-th stage is turned on or off according to voltage applied to the reset node QB, and interconnects the output terminal OT of the p-th stage and a third discharging voltage line transferring a third discharging voltage VSS3 when turned on.

The fourth switching device Tr4 and the pull-up switching device Pu are supplied with the same output clock pulse.

The first to third discharging voltages VSS1 to VSS3 may have the same properties as those of the third embodiment.

A rising edge of the output clock pulse supplied to the pull-up switching device Pu may be located in a high period of the output control clock pulse supplied to the first switching device Tr1.

The construction of a stage according to a tenth embodiment will be described with reference to FIG. 16.

Figure 16:
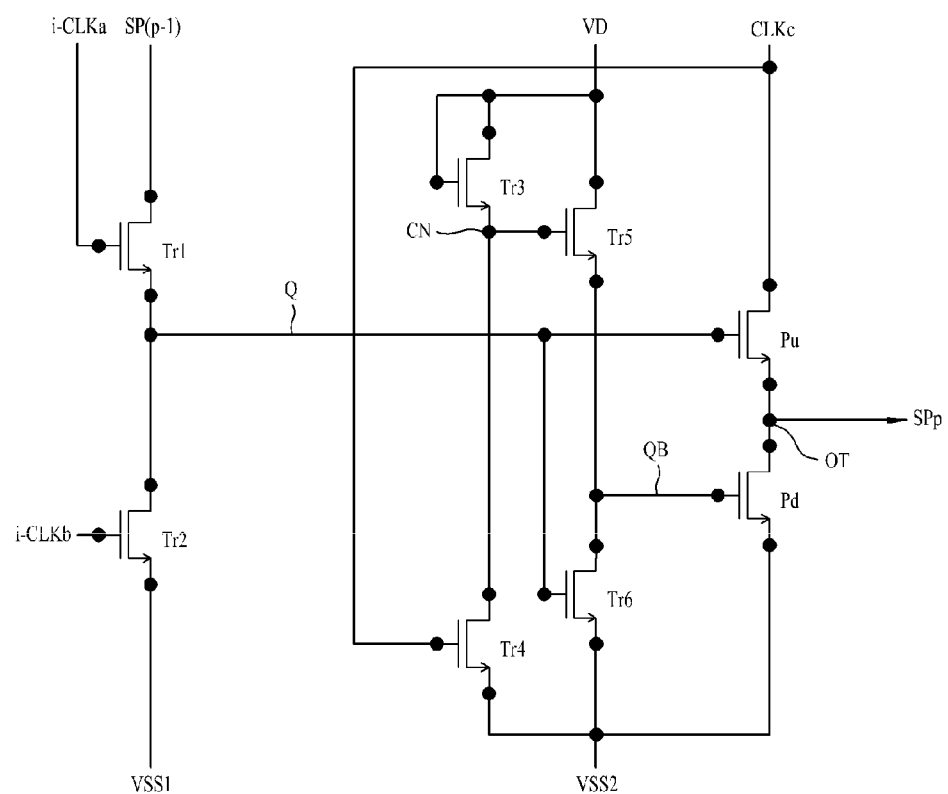

As shown in FIG. 16, a p-th stage includes first to sixth switching devices Tr1 to Tr6, a pull-up switching device Pu, and a pull-down switching device Pd.

The first switching device Tr1 included in the p-th stage is turned on or off according to a positive iso clock pulse, and interconnects an output terminal OT of a (p−1)-th stage and a set node Q when turned on. If the p-th stage is a first stage to which a start pulse is supplied, the first switching device Tr1 is connected to a start transfer line instead of the output terminal OT of the (p−1)-th stage. The start pulse is supplied to the start transfer line.

The second switching device Tr2 included in the p-th stage is turned on or off according to a negative iso clock pulse, and interconnects the set node Q and a first discharging voltage line transferring a first discharging voltage VSS1 when turned on.

The third switching device Tr3 included in the p-th stage is turned on or off according to an output clock pulse from an output clock line, and interconnects a charging voltage line transferring a charging voltage VDD and a common node CN when turned on.

The fourth switching device Tr4 included in the p-th stage is turned on or off according to voltage applied to the set node Q, and interconnects the common node CN and a second discharging voltage line transferring a second discharging voltage VSS2 when turned on.

The fifth switching device Tr5 included in the p-th stage is turned on or off according to voltage applied to the common node CN, and interconnects the charging voltage line and a reset node QB when turned on.

The sixth switching device Tr6 included in the p-th stage is turned on or off according to voltage applied to the set node Q, and interconnects the reset node QB and the second discharging voltage line when turned on.

The pull-up switching device Pu included in the p-th stage is turned on or off according to voltage applied to the set node Q, and interconnects an output clock line and an output terminal OT of the p-th stage when turned on. An output clock pulse CLKc is supplied to the output clock line connected to the pull-up switching device Pu. If CLKc is a first output clock pulse CLK1, i-CLKa and i-CLKb may be a first output control clock pulse i-CLK1 and a fourth output control clock pulse i-CLK4, respectively.

The pull-down switching device Pd included in the p-th stage is turned on or off according to voltage applied to the reset node QB, and interconnects the output terminal OT of the p-th stage and the second discharging voltage line when turned on.

The first and second discharging voltages VSS1 and VSS2 may have the same properties as those of the second embodiment. Alternatively, the first and second discharging voltages VSS1 and VSS2 may have the same properties as those of the third embodiment.

A rising edge of the output clock pulse supplied to the pull-up switching device Pu may be located in a high period of the output control clock pulse supplied to the first switching device Tr1.

The construction of a stage according to an eleventh embodiment will be described with reference to FIG. 17.

Figure 17:
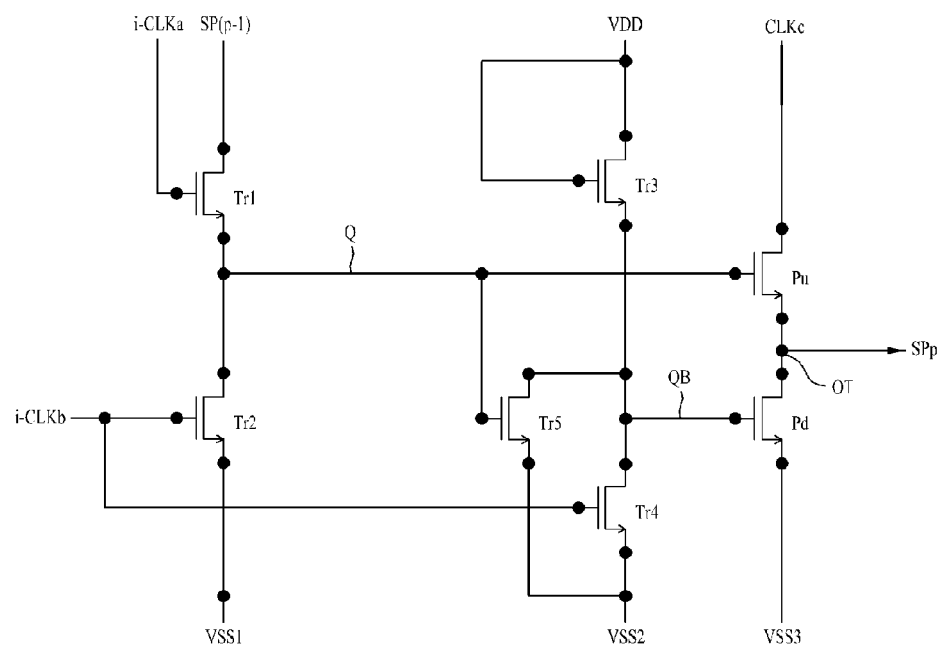

As shown in FIG. 17, a p-th stage includes first to fifth switching devices Tr1 to Tr5, a pull-up switching device Pu, and a pull-down switching device Pd.

The first switching device Tr1 included in the p-th stage is turned on or off according to a positive iso clock pulse, and interconnects an output terminal OT of a (p−1)-th stage and a set node Q when turned on. If the p-th stage is a first stage to which a start pulse is supplied, the first switching device Tr1 is connected to a start transfer line instead of the output terminal OT of the (p−1)-th stage. The start pulse is supplied to the start transfer line.

The second switching device Tr2 included in the p-th stage is turned on or off according to a negative iso clock pulse, and interconnects the set node Q and a first discharging voltage line transferring a first discharging voltage VSS1 when turned on.

The third switching device Tr3 included in the p-th stage is turned on according to a charging voltage VDD from a charging voltage line, and interconnects the charging voltage line and a reset node QB.

The fourth switching device Tr4 included in the p-th stage is turned on or off according to an output clock pulse from an output clock line, and interconnects a reset node QB and a second discharging voltage line transferring a second discharging voltage VSS2 when turned on.

The fifth switching device Tr5 included in the p-th stage is turned on or off according to voltage applied to the set node Q, and interconnects the reset node QB and a second discharging voltage line transferring a second discharging voltage VSS2 when turned on.

The pull-up switching device Pu included in the p-th stage is turned on or off according to voltage applied to the set node Q, and interconnects an output clock line and an output terminal OT of the p-th stage when turned on. An output clock pulse CLKc is supplied to the output clock line connected to the pull-up switching device Pu. If CLKc is a first output clock pulse CLK1, i-CLKa and i-CLKb may be a first output control clock pulse i-CLK1 and a fourth output control clock pulse i-CLK4, respectively.

The pull-down switching device Pd included in the p-th stage is turned on or off according to voltage applied to the reset node QB, and interconnects the output terminal OT of the p-th stage and the second discharging voltage line when turned on.

The first to third discharging voltages VSS1 to VSS3 may have the same properties as those of the third embodiment.

A rising edge of the output clock pulse supplied to the pull-up switching device Pu may be located in a high period of the output control clock pulse supplied to the first switching device Tr1.

Hereinafter, a description will be given of the operation of the stage of FIG. 9 according to the first to fourth output clock pulses CLK1 to CLK4 and the first to fourth output control clock pulses i-CLK1 to i-CLK4 of FIG. 4.

On the assumption that the stage of FIG. 9 is a fifth stage, it can be seen that i-CLKa is a first output control clock pulse i-CLK1, i-CLKb is a fourth output control clock pulse i-CLK4, CLKc is a first clock pulse, SP(p−1) is a scan pulse from a fourth stage, and SP(p+1) is a scan pulse from a sixth stage. Also, it is assumed that first to third discharging voltages VSS1 to VSS3 are the same.

First, when the first output control clock pulse i-CLK1 is maintained at a high voltage, the first and eighth switching devices Tr1 and Tr8 are turned on. As a result, a scan pulse from the fourth stage is supplied to the set node Q through the turned-on first switching device Tr1, and a charging voltage VDD is supplied to the set node Q through the turned-on eighth switching device Tr8. Consequently, the set node Q is charged, and the pull-up switching device Pu and the fourth switching device Tr, connected to the charged set node Q via gate electrodes, are turned on. Also, a second discharging voltage VSS2 is supplied to the reset node QB through the turned-on fourth switching device Tr4. As a result, the reset node QB is discharged, and therefore, the pull-down switching device Pd, connected to the discharged reset node QB via a gate electrode, is turned off.

Subsequently, when the first output clock pulse CLK1 is maintained at a high voltage, the first output clock pulse CLK1 is output as a scan pulse through the turned-on pull-up switching device Pu. The scan pulse is supplied to a fifth gate line, the fourth stage (fifth and seventh switching devices Tr5 and Tr7) and the sixth stage (first and eighth switching devices Tr1 and Tr8) through an output terminal OT. In other words, a scan pulse having a high voltage is supplied to the output terminal OT. As a result, the sixth switching device Tr6, connected to the output terminal OT via a gate electrode, is turned on, and a second discharging voltage VSS2 is supplied to the reset node QB through the turned-on sixth switching device Tr6.

Meanwhile, the third switching device Tr3 is turned on by the first output clock pulse CLK1, and a charging voltage VDD is supplied to the reset node QB through the turned-on third switching device Tr3. The reset node QB is maintained in a discharged state irrespective of the charging voltage VDD since the reset node QB is supplied with the second discharging voltage VSS2 through the fourth and sixth switching devices Tr4 and Tr6.

Subsequently, a scan pulse from the sixth stage is supplied to a gate electrode of the fifth switching device Tr5 and a gate electrode of the seventh switching device Tr7, whereby the fifth switching device Tr5 and the seventh switching device Tr7 are turned on. As a result, a first discharging voltage VSS1 is supplied to the set node Q through the turned-on fifth switching device Tr5 to discharge the set node Q. Consequently, the set node Q is discharged, and the pull-up switching device Pu and the fourth switching device Tr4, connected to the set node Q via gate electrodes, are turned off. Meanwhile, a third discharging voltage VSS is supplied to the output terminal OT through the turned-on seventh switching device Tr7. Consequently, the output terminal OT is discharged, and the sixth switching device Tr6, connected to the discharged output terminal OT via a gate electrode, is turned off.

Meanwhile, as the fourth and sixth switching devices Tr4 and Tr6 are turned off, the reset node QB is charged with a charging voltage VDD supplied by the turned-on third switching device Tr3. That is, the scan pulse from the sixth stage is generated by the second output clock pulse CLK2. The third switching device Tr3 is turned on to charge the reset node QB for a period corresponding to a ⅓ period in which the second output clock pulse CLK2 and the first output clock pulse CLK1 overlap with each other. As a result, the pull-down switching device Pd, connected to the charged reset node QB via a gate electrode, is turned on. Consequently, a third discharging voltage VSS3 is supplied to the output terminal OT through the turned-on pull-down switching device Pd.

Afterward, the second switching device Tr2 is turned on when the fourth output control clock pulse i-LCK4 is maintained at a high voltage, and a first discharging voltage VSS1 is supplied to the set node Q through the turned-on second switching device Tr2. As a result, the set node Q is discharged.

According to the present invention, a low voltage of an output control clock pulse is set to be lower than that (corresponding to a low voltage of a scan pulse) of an output control clock pulse and to be lower than first to third discharging voltages VSS1 to VSS3. Consequently, it is possible to minimize current leakage through the first and second switching devices Tr1 and Tr2 for a period in which the output control clock pulse is maintained at the low voltage.

On the other hand, a description will hereinafter be given of the operation of the stage of FIG. 10 according to the first to fourth output clock pulses CLK1 to CLK4 and the first to fourth output control clock pulses i-CLK1 to i-CLK4 of FIG. 4.

On the assumption that the stage of FIG. 10 is a fifth stage, it can be seen that i-CLKa is a first output control clock pulse i-CLK1, i-CLKb is a fourth output control clock pulse i-CLK4, CLKc is a first clock pulse, and SP(p−1) is a scan pulse from a fourth stage. Also, it is assumed that first to third discharging voltages VSS1 to VSS3 are the same.

First, when the first output control clock pulse i-CLK1 is maintained at a high voltage, the first switching device Tr1 is turned on. As a result, a scan pulse from the fourth stage is supplied to the set node Q through the turned-on first switching device Tr1. Consequently, the set node Q is charged, and the pull-up switching device Pu, the fourth switching device Tr4, and the sixth switching device Tr6, connected to the charged set node Q via gate electrodes, are turned on. Also, a second discharging voltage VSS2 is supplied to the common node CN through the turned-on fourth switching device Tr4. As a result, the common node CN is discharged, and therefore, the fifth switching device Try, connected to the common node CN via a gate electrode, is turned off. On the other hand, a second discharging voltage is supplied to the reset node QB through the turned-on sixth switching device Tr6. As a result, the reset node QB is discharged, and therefore, the pull-down switching device Pd, connected to the discharged reset node QB via a gate electrode, is turned off.

Subsequently, when the first output clock pulse CLK1 is maintained at a high voltage, the first output clock pulse CLK1 is output as a scan pulse through the turned-on pull-up switching device Pu. The scan pulse is supplied to a fifth gate line and the sixth stage (first switching device Tr1 thereof) through an output terminal OT. Meanwhile, the third switching device Tr3 is turned on by the first output clock pulse CLK1, and a charging voltage VDD is supplied to the common node CN through the turned-on third switching device Tr3. The common node CN is maintained in a discharged state irrespective of the charging voltage VDD since the common node CN is supplied with the second discharging voltage VSS2 through the fourth switching device Tr4.

Subsequently, when the fourth output control clock pulse i-CLK4 is maintained at a high voltage, the second switching device Tr2 is turned on, and a first discharging voltage VSS1 is supplied to the set node Q through the turned-on second switching device Tr2. As a result, the set node Q is discharged, and the pull-up switching device Pu, the fourth switching device Tr4, and the sixth switching device Tr6, connected to the set node Q via gate electrodes, are turned off.

Meanwhile, as the fourth switching device Tr4 is turned off, the common node CN is charged with a charging voltage VDD supplied by the turned-on third switching device Tr3. That is, the scan pulse from the sixth stage is generated by the second output clock pulse CLK2. The third switching device Tr3 is turned on to charge the common node CN for a period corresponding to a ⅓ period in which the second output clock pulse CLK2 and the first output clock pulse CLK1 overlap with each other. As a result, the fifth switching device Tr5, connected to the common node CN via a gate electrode, is turned on. Consequently, the charging voltage VDD is supplied to the reset node QB through the turned-on fifth switching device Tr5. As a result, the reset node QB is charged, and the pull-up switching device Pu, connected to the charged reset node QB via a gate electrode, is turned on. A third discharging voltage VSS3 is supplied to the fifth gate line and the sixth stage (first switching device Tr1 thereof) through the turned-on pull-up switching device Pu.

According to the present invention, a low voltage of an output control clock pulse is set to be lower than that (corresponding to a low voltage of a scan pulse) of an output control clock pulse and to be lower than first to third discharging voltages VSS1 to VSS3. Consequently, it is possible to minimize current leakage through the first and second switching devices Tr1 and Tr2 for a period in which the output control clock pulse is maintained at the low voltage.

Figure 18:
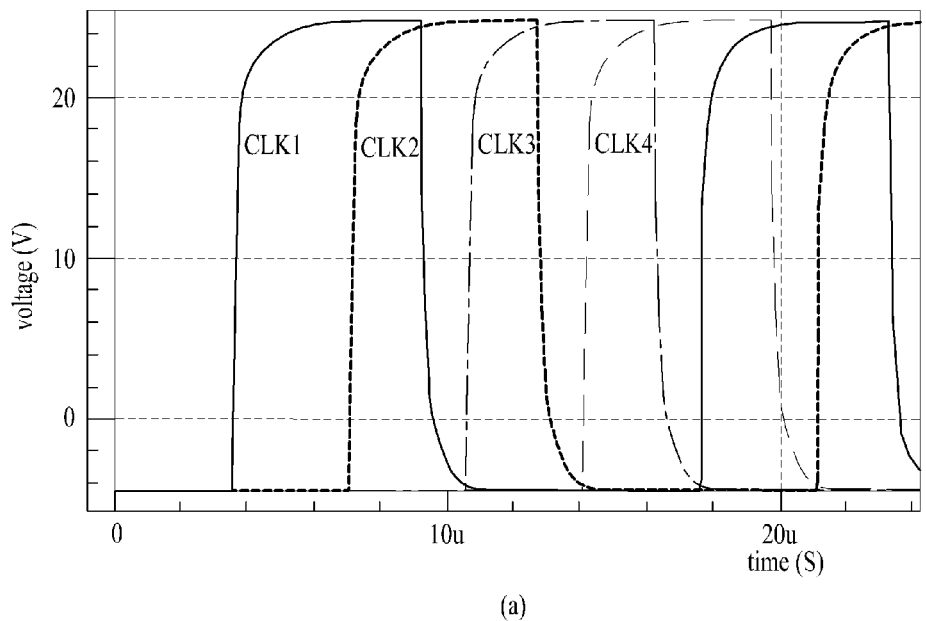
FIG. 18 is a view showing simulation waveforms of first to fourth output clock pulses and first to fourth output control clock pulses of FIG. 4.
Figure 18:
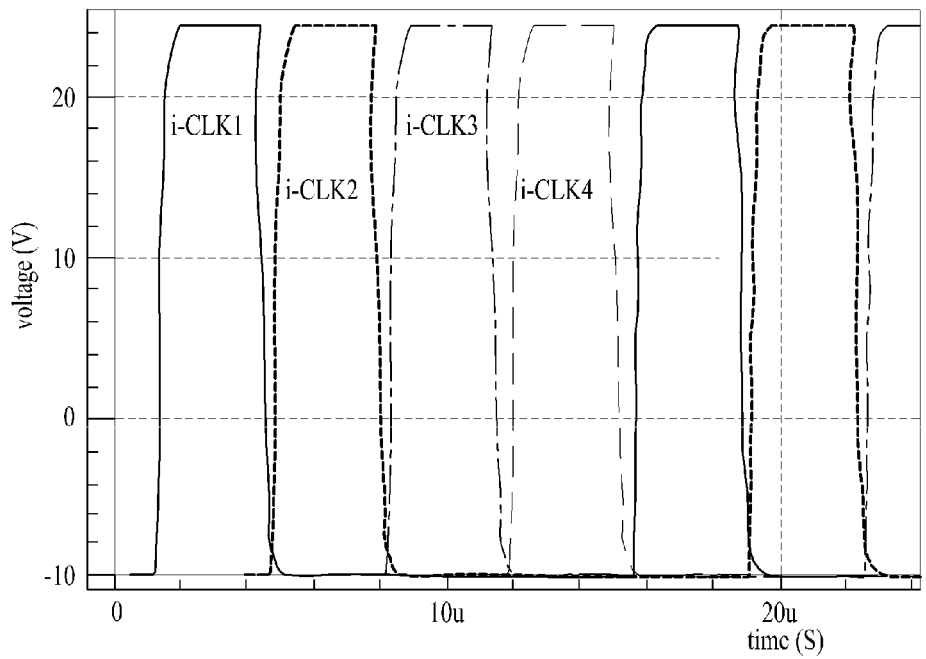

FIG. 18 is a view showing simulation waveforms of the first to fourth output clock pulses CLK1 to CLK4 and the first to fourth output control clock pulses i-CLK1 to i-CLK4 of FIG. 4, wherein FIG. 18(a) shows the first to fourth output clock pulses CLK1 to CLK4, and FIG. 18(b) shows the first to fourth output control clock pulses i-CLK1 to i-CLK4.

Figure 19:
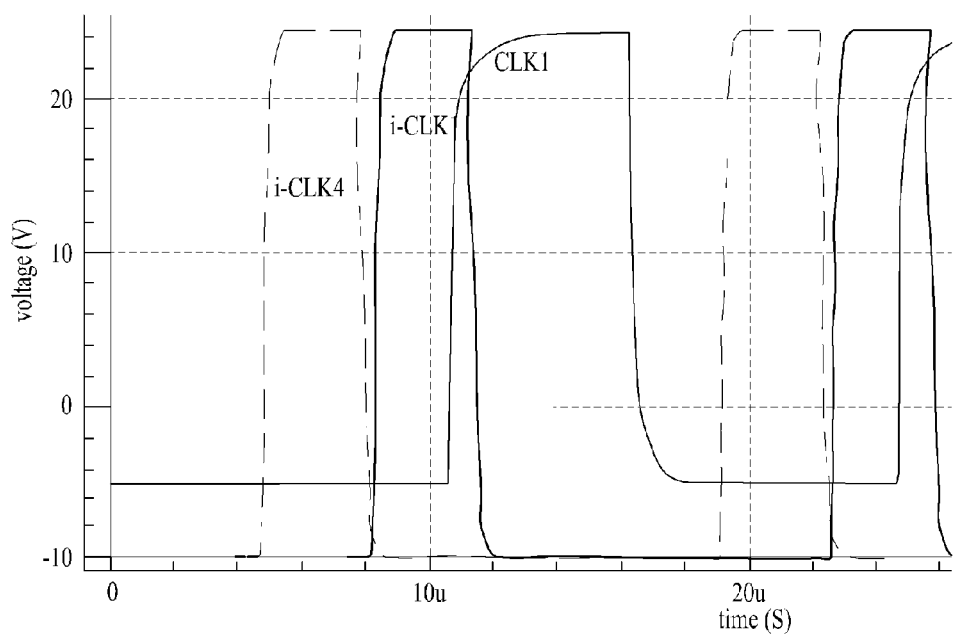
FIG. 19 is a view showing simulation waveforms of a positive iso clock pulse and a negative iso clock pulse with respect to the first output clock pulse of FIG. 18.

FIG. 19 is a view showing simulation waveforms of a positive iso clock pulse and a negative iso clock pulse with respect to the first output clock pulse CLK1 of FIG. 18.

Figure 20:
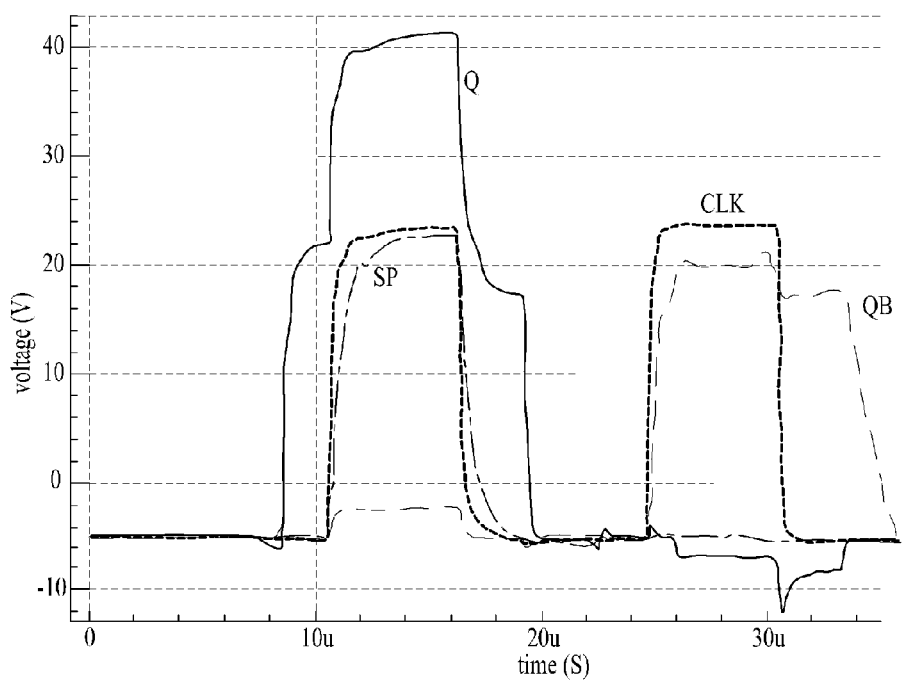
FIG. 20 is a view showing simulation waveforms of voltages at a set node and at a reset node and voltages of a scan pulse and an output clock pulse, generated according to the operation of a stage of FIG. 8.

FIG. 20 is a view showing simulation waveforms of voltages at the set node Q, at the reset node QB, of the scan pulse and of the output clock pulse, generated according to the operation of the stage of FIG. 8. As can be seen from this drawing, the first switching device Tr1 is turned on to charge the set node Q for a period in which the first output control clock pulse i-CLK1 and a scan pulse SP(p−1) from an upstream stage thereof are maintained at a high voltage. At this time, the fourth output control clock pulse i-CLK4 is maintained at a low voltage, and therefore, the second switching device Tr2 is turned off. Afterward, if the voltage of the first output clock pulse CLK1 transitions to a high voltage, a scan pulse is generated. Afterward, when the fourth output control clock pulse i-CLK4 has a high voltage, the set node Q is discharged.

In a circuit having a negative threshold voltage, leakage current flows due to the first output clock pulse CLK1 while the set node Q is maintained at a low voltage. Consequently, it is preferable to restrain the increase of voltage at the set node Q through clock coupling. According to the present invention, when the set node Q is maintained at a low voltage due to a discharging voltage, noise charge generated by the first output clock pulse CLK1 flows out through a gate light and a pull-down switching device Pd connected to an upstream stage thereof while the first output clock pulse CLK1 is maintained at a high voltage.

Figure 21:
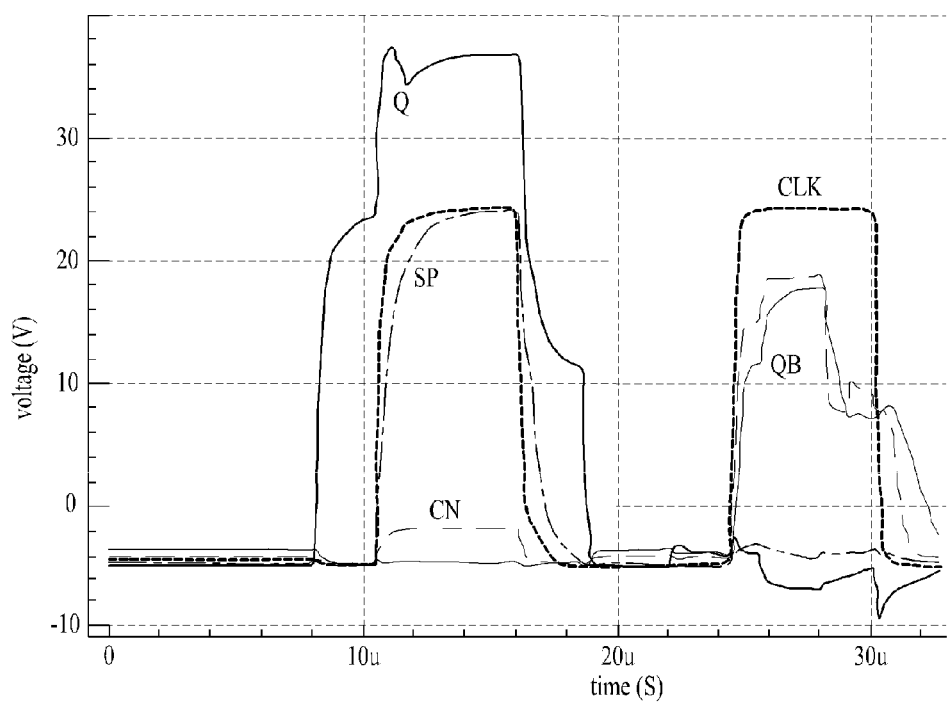
FIG. 21 is a view showing simulation waveforms of voltages at a set node and at a reset node and voltages of a scan pulse and an output clock pulse, generated according to the operation of a stage of FIG. 11.

FIG. 21 is a view showing simulation waveforms of voltages at the set node Q, at the reset node QB, of the scan pulse and of the output clock pulse, generated according to the operation of the stage of FIG. 11.

Figure 22:
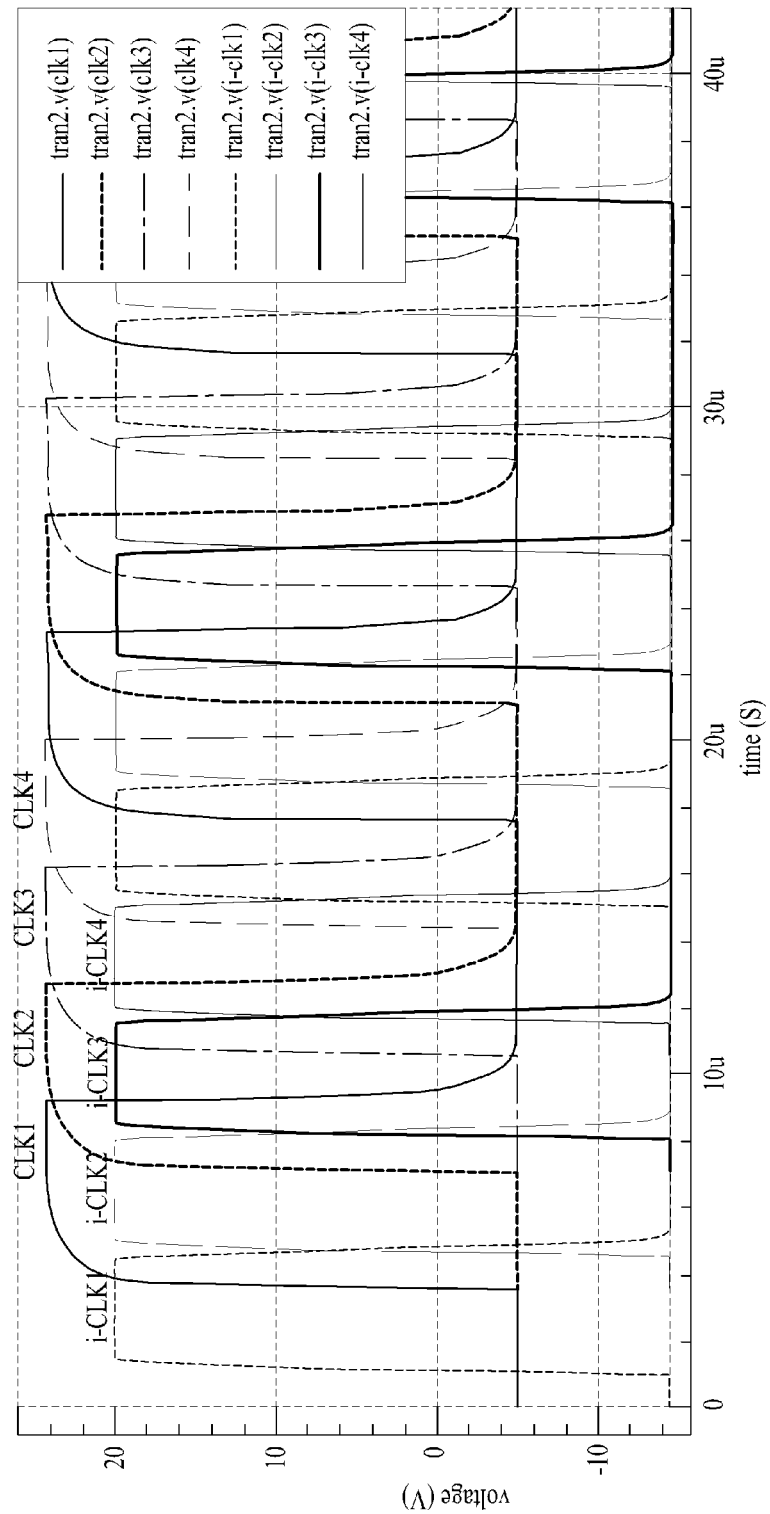
FIG. 22 is a view showing simulation waveforms of output control clock pulses and output clock pulses supplied to stages of FIGS. 13 and 14.

FIG. 22 is a view showing simulation waveforms of the output control clock pulses and the output clock pulses supplied to the stages of FIGS. 13 and 14. Referring to FIG. 22, each of the first to fourth output clock pulses CLK1 to CLK4 has a voltage (high voltage) of 25V in a high period thereof and a voltage (low voltage) of −5V in a low period thereof. Also, each of the first to fourth output control clock pulses i-CLK1 to i-CLK4 has a voltage (high voltage) of 20V in a high period thereof and a voltage (low voltage) of −15V in a low period thereof.

Figure 23:
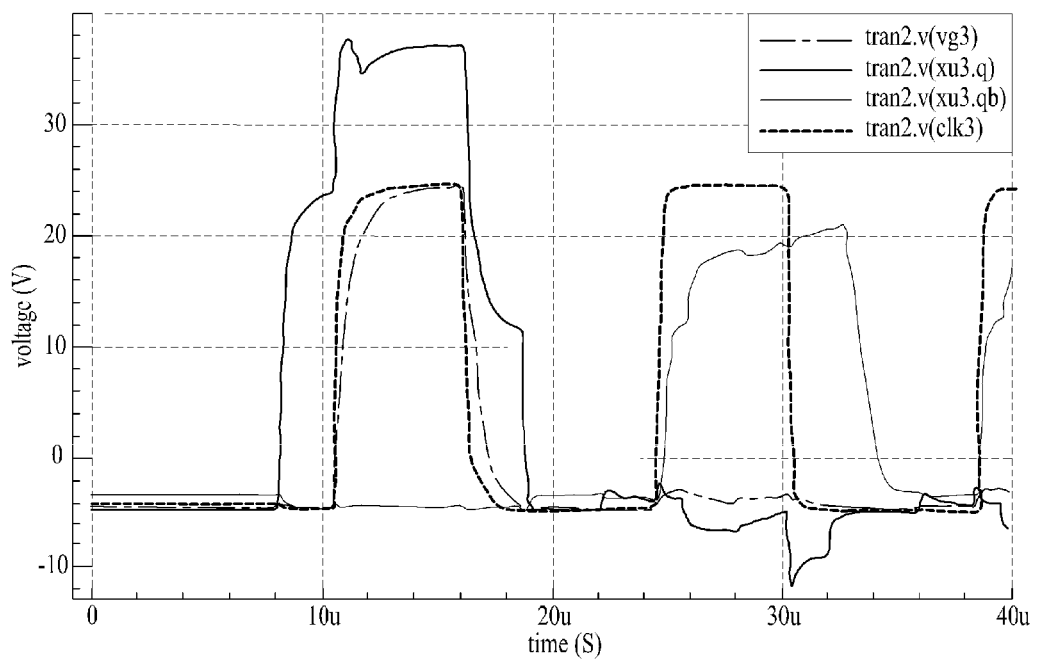
FIG. 23 is a view showing simulation waveforms of voltages at a set node and at a reset node and voltages of a scan pulse and an output clock pulse, generated according to the operation of a stage of FIG. 10.

FIG. 23 is a view showing simulation waveforms of voltages at the set node Q, at the reset node QB, of the scan pulse and of the output clock pulse, generated according to the operation of the stage of FIG. 10.

Figure 24:
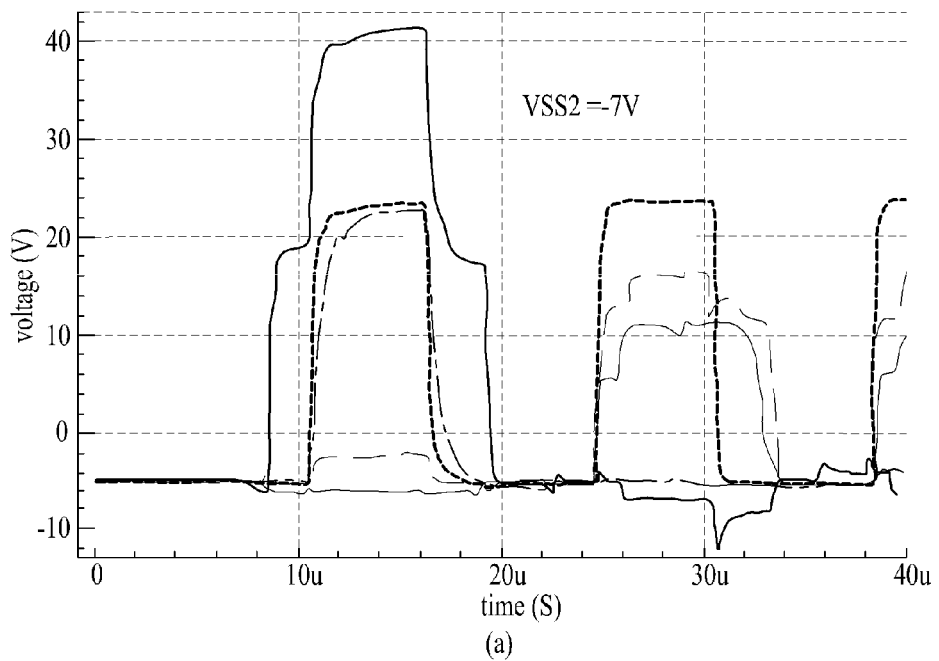
FIG. 24 is a view showing simulation waveforms of voltages at a set node and at a reset node and voltages of a scan pulse and an output clock pulse, generated according to the operation of a stage of FIG. 12.
Figure 24:
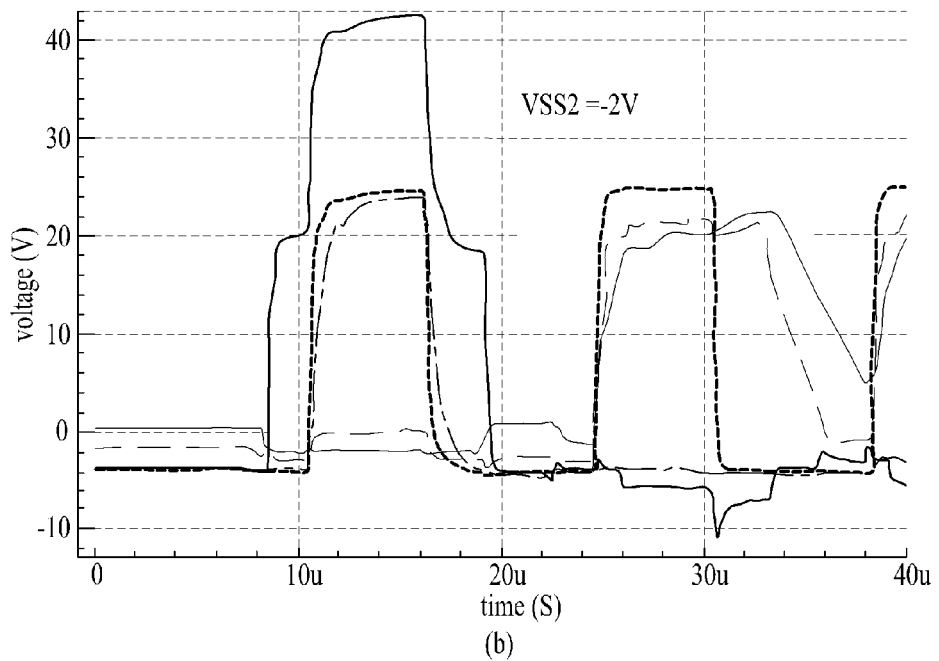

FIG. 24 is a view showing simulation waveforms of voltages at the set node Q, at the reset node QB, of the scan pulse and of the output clock pulse, generated according to the operation of the stage of FIG. 12. Specifically, FIG. 24(a) shows voltages at the set node Q, at the reset node QB, of the scan pulse and of the output clock pulse under the condition that the first and third discharging voltages VSS1 and VSS3 are −5V and the second discharging voltage VSS2 is −7V, and FIG. 24(b) shows voltages at the set node Q, at the reset node QB, of the scan pulse and of the output clock pulse under conditions that the first and third discharging voltages VSS1 and VSS3 are −5V and the second discharging voltage VSS2 is −2V.

Figure 25:
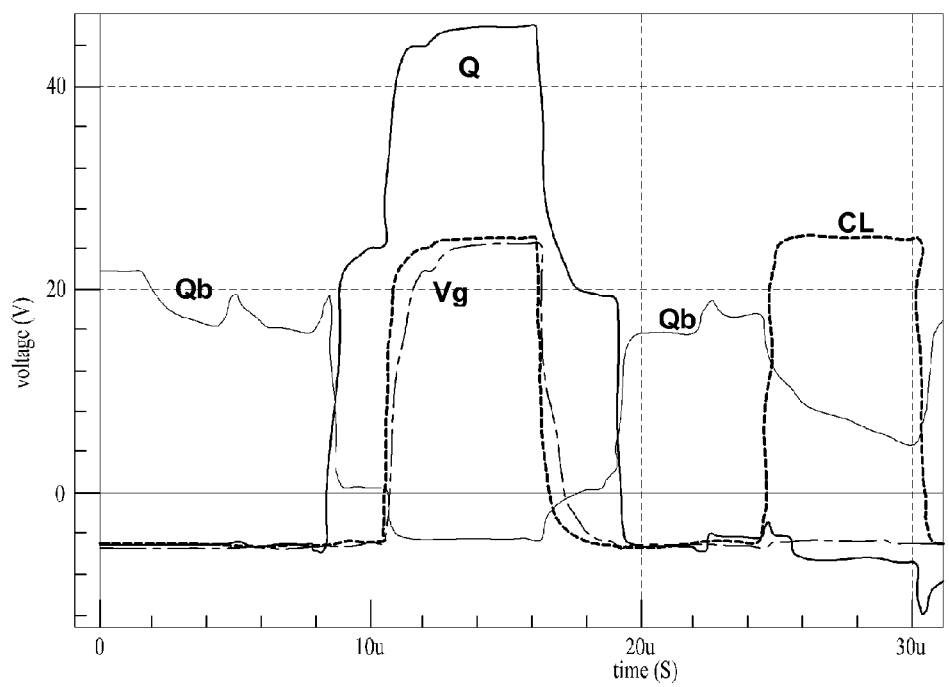
FIG. 25 is a view showing simulation waveforms of voltages at a set node and at a reset node and voltages of a scan pulse and an output clock pulse, generated according to the operation of a stage of FIG. 16.

FIG. 25 is a view showing simulation waveforms of voltages at the set node Q, at the reset node QB, of the scan pulse and of the output clock pulse, generated according to the operation of the stage of FIG. 16.

Figure 26:
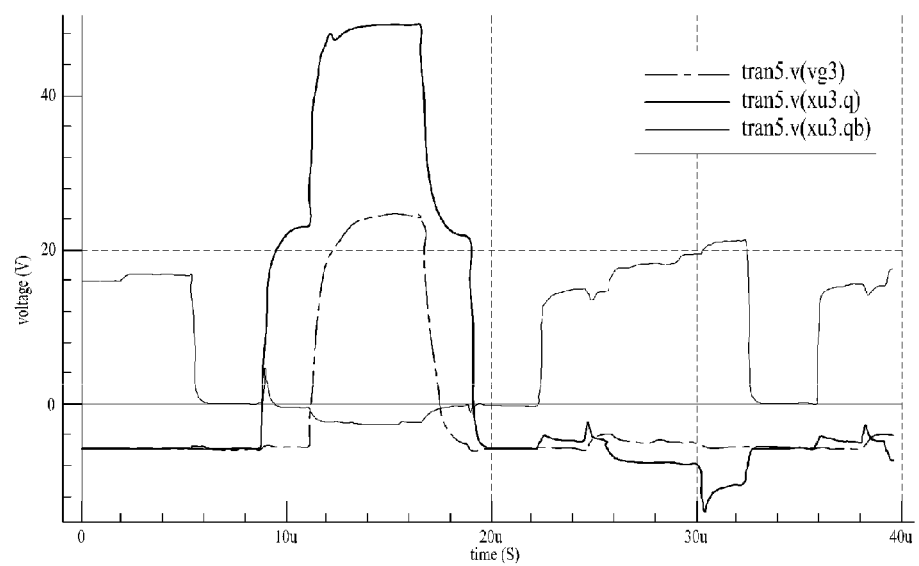
FIG. 26 is a view showing simulation waveforms of voltages at a set node and at a reset node and voltages of a scan pulse and an output clock pulse, generated according to the operation of a stage of FIG. 17.

FIG. 26 is a view showing simulation waveforms of voltages at the set node Q, at the reset node QB, of the scan pulse and of the output clock pulse, generated according to the operation of the stage of FIG. 17.

Figure 27:
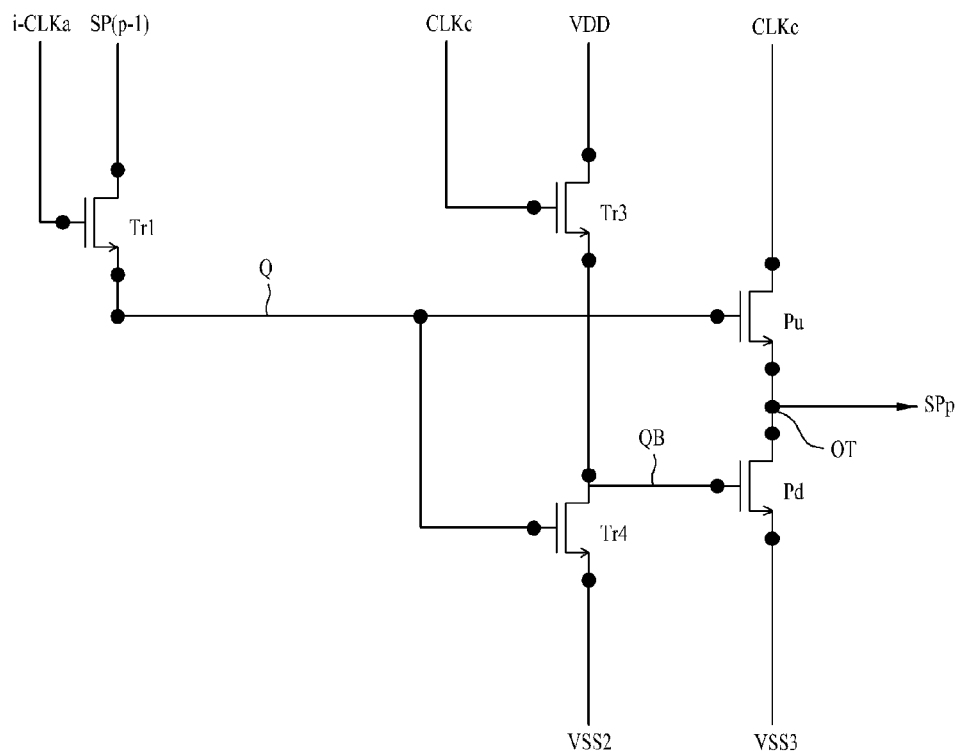
FIG. 27 is a view showing a modified structure of FIG. 8.

FIG. 27 is a view showing a modified structure of FIG. 8.

As shown in FIG. 27, the stage of FIG. 8 does not include the second switching device Tr2. That is, as shown in FIG. 27, the p-th stage may include a first switching device Tr1, a third switching device Tr3, a fourth switching device Tr4, a pull-up switching device Pu, and a pull-down switching device Pd. In this case, a set node Q is discharged by a low voltage from a gate line connected to an upstream stage (i.e. prior stage) thereof.

The first switching device Tr1, the third switching device Tr3, the fourth switching device Tr4, the pull-up switching device Pu, and the pull-down switching device Pd shown in FIG. 27 are identical to the first switching device Tr1, the third switching device Tr3, the fourth switching device Tr4, the pull-up switching device Pu, and the pull-down switching device Pd shown in FIG. 8.

In this case, a high period of an output control clock pulse i-CLKa supplied to a (p−q)-th stage may partially overlap with a high period of an output control clock pulse i-CLKa supplied to the p-th stage.

Meanwhile, a charging voltage VDD, instead of an output clock pulse CLKc, may be applied to a gate electrode of the third switching device Tr3 of the FIG. 27.

A rising edge of the output clock pulse supplied to the pull-up switching device Pu may be located in a high period of the output control clock pulse supplied to the first switching device Tr1.

Figure 28:
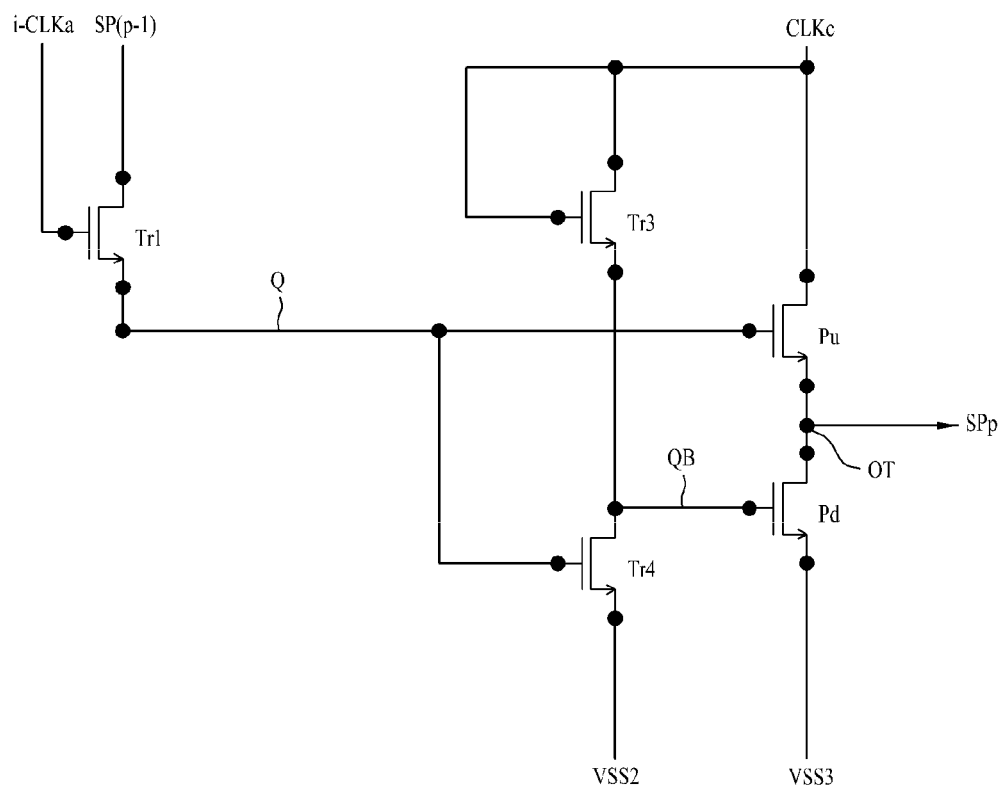
FIG. 28 is a view showing a modified structure of FIG. 27.

FIG. 28 is a view showing a modified structure of FIG. 27.

The third switching device Tr3 shown in FIG. 27 may have a connection structure shown in FIG. 28.

That is, as shown in FIG. 28, the third switching device Tr3 is turned on or off according to an output clock pulse from an output clock line, and interconnects the output clock line and a reset node QB when turned on. An output clock pulse CLKc is supplied to the output clock line connected to the third switching device Tr3. If CLKc is a first output clock pulse CLK1, i-CLKa and i-CLKb may be a first output control clock pulse i-CLK1 and a fourth output control clock pulse i-CLK4, respectively.

In this case, a high period of an output control clock pulse i-CLKa supplied to a (p−q)-th stage may partially overlap with a high period of the output control clock pulse i-CLKa supplied to the p-th stage.

A rising edge of the output clock pulse supplied to the pull-up switching device Pu may be located in a high period of the output control clock pulse supplied to the first switching device Tr1.

Figure 29:
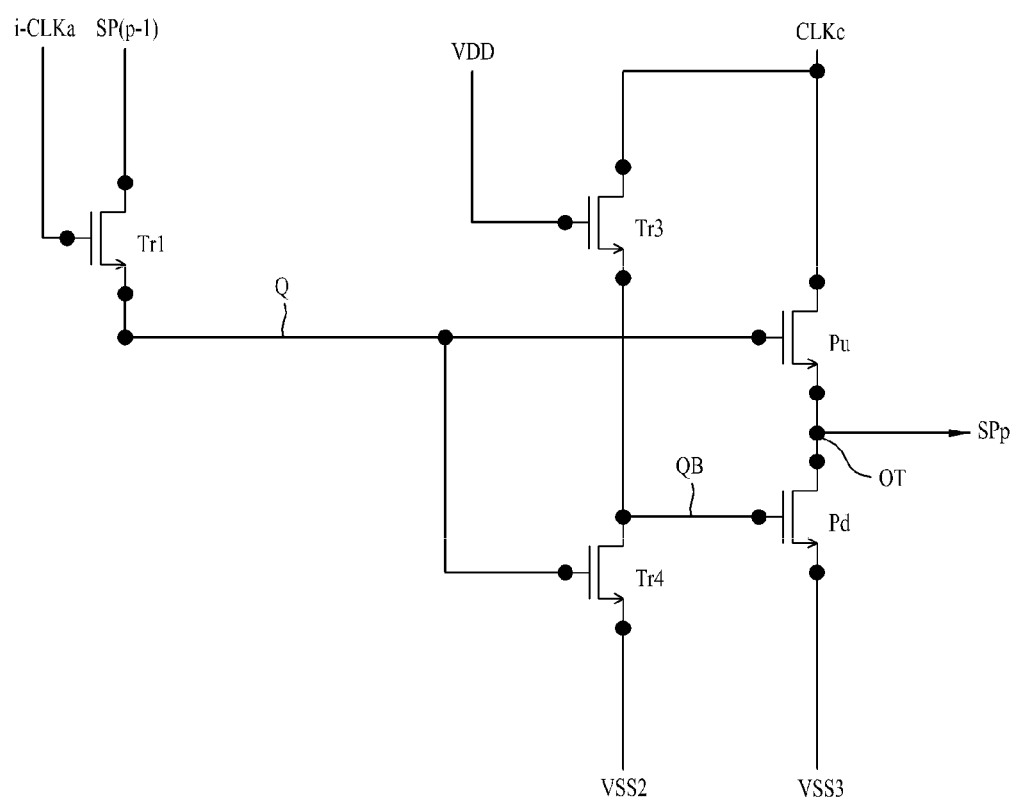
FIG. 29 is a view showing another modified structure of FIG. 27.

FIG. 29 is a view showing another modified structure of FIG. 27.

The third switching device Tr3 shown in FIG. 27 may have a connection structure shown in FIG. 29.

That is, as shown in FIG. 29, the third switching device Tr3 is turned on according to a charging voltage VDD from a charging voltage line, and interconnects an output clock line and a reset node QB. An output clock pulse CLKc is supplied to the output clock line connected to the third switching device Tr3. If CLKc is a first output clock pulse CLK1, i-CLKa and i-CLKb may be a first output control clock pulse i-CLK1 and a fourth output control clock pulse i-CLK4, respectively.

Meanwhile, the output clock pulse CLKc, instead of the charging voltage VDD, may be applied to a gate electrode of the third switching device Tr3 of FIG. 29.

A rising edge of the output clock pulse supplied to the pull-up switching device Pu may be located in a high period of the output control clock pulse supplied to the first switching device Tr1.

Figure 30:
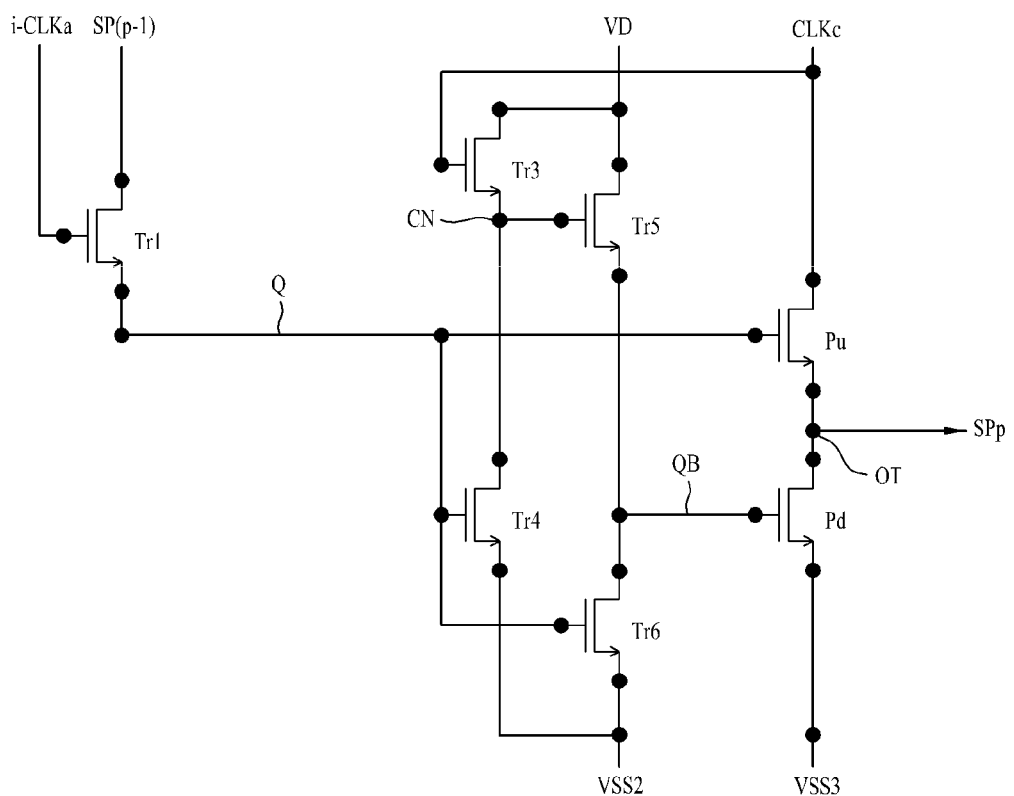
FIG. 30 is a view showing another modified structure of FIG. 10.

FIG. 30 is a view showing another modified structure of FIG. 10.

As shown in FIG. 30, the stage of FIG. 10 does not include the second switching device Tr2. That is, as shown in FIG. 30, the p-th stage may include a first switching device Tr1, third to sixth switching devices Tr3 to Tr6, a pull-up switching device Pu, and a pull-down switching device Pd. In this case, a set node Q is discharged by a low voltage from a gate line connected to an upstream stage (i.e. prior stage) thereof. Meanwhile, a drain electrode of the third switching device Tr3 of FIG. 30 may be connected to a charging voltage line instead of an output clock line.

In this case, a high period of an output control clock pulse i-CLKa supplied to a (p−q)-th stage may partially overlap with a high period of an output control clock pulse i-CLKa supplied to the p-th stage.

Meanwhile, a charging voltage VDD, instead of an output clock pulse CLKc, may be applied to a gate electrode of the third switching device Tr3 of the FIG. 30.

A rising edge of the output clock pulse supplied to the pull-up switching device Pu may be located in a high period of the output control clock pulse supplied to the first switching device Tr1.

Meanwhile, in all the embodiments, two identical discharging voltages may be supplied through separate discharging voltage lines or through a single discharging voltage line.

As is apparent from the above description, a gate driving circuit according to the present invention is configured so that a low voltage of an output control clock pulse is lower than that (corresponding to a low voltage of a scan pulse) of an output control clock pulse and is lower than first to third discharging voltages. Consequently, it is possible to minimize current leakage through first and second switching devices for a period in which the output control clock pulse is maintained at the low voltage, thereby stabilizing output from a shift register.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A gate driving circuit, comprising:
a first clock generator to output n (n being a natural number equal to or greater than 2) output control clock pulses having different phases;
a second clock generator to create m*n (m being a natural number) output clock pulses having different phases and partially overlapped with one another in high periods thereof, to arrange the m*n output clock pulses in sequence of phase, to bind the m*n output clock pulses arranged in sequence of phase in units of n to generate m groups, each of which has n output clock pulses, and to output the m*n output clock pulses so that a rising edge of an output clock pulse having a k-th sequence of phase included in each group is located in a high period of an output control clock pulse having a k-th sequence of phase among the n output control clock pulses; and
a shift register to receive the n output control clock pulses from the first clock generator and the m*n output clock pulses from the second clock generator and to sequentially output a plurality of scan pulses,
wherein the n output control clock pulses and the m*n output clock pulses each comprise a plurality of impulses which is periodically generated, and
wherein a rising edge of an impulse included in an output clock pulse having a k-th sequence of phase and belonging to a j-th (j is natural number equal to or less than m) group is located in a high period of an impulse having a k-th sequence of phase.

2. The gate driving circuit according to claim 1, wherein the m*n-th output clock pulse further comprises a dummy impulse, and
the dummy impulse has the same output timing as a start pulse having a phase preceding that of a first output clock pulse.

3. The gate driving circuit according to claim 1, wherein voltage of each of the n output control clock pulses in a low period thereof is lower than or equal to voltage of each of the m*n output clock pulses in a low period thereof.

4. The gate driving circuit according to claim 3, wherein each of the m*n output clock pulses does not overlap with at least one of the n output control clock pulses.

5. The gate driving circuit according to claim 4, wherein
the shift register comprises a plurality of stages to sequentially output scan pulses,
each of the stages outputs a scan pulse through an output terminal thereof,
the n output control clock pulses are transferred through n output control clock lines,
the m*n output clock pulses are transferred through m*n output clock lines,
a p-th (p being a natural number) stage comprises:
a first switching device turned on or off according to any one of the n output control clock pulses, and interconnecting an output terminal of a (p−q)-th (q being a natural number less than p) stage or a start transfer line transferring a start pulse and a set node when turned on;
a second switching device turned on or off according to any one of the n output control clock pulses, and interconnecting the set node and a first discharging voltage line transferring a first discharging voltage when turned on; and
a pull-up switching device turned on or off according to voltage applied to the set node, and interconnecting any one of the output clock lines and an output terminal of the p-th stage when turned on,
a high period of the output clock pulse does not overlap with a high period of the output control clock pulse supplied to the second switching device,
voltage of each of the n output control clock pulses in the low period thereof is lower than or equal to the first discharging voltage,
a high period of the output clock pulse supplied to the (p−q)-th stage partially overlaps with a high period of the output clock pulse supplied to the p-th stage, and
a rising edge of the output clock pulse supplied to the pull-up switching device is located in a high period of the output control clock pulse supplied to the first switching device.

6. The gate driving circuit according to claim 5, wherein q is 1 or 2.

7. The gate driving circuit according to claim 5, wherein the p-th stage further comprises:
a third switching device turned on or off according to an output clock pulse from any one of the output clock lines, and interconnecting a charging voltage line transferring a charging voltage and a reset node when turned on;
a fourth switching device turned on or off according to voltage applied to the set node, and interconnecting the reset node and a second discharging voltage line transferring a second discharging voltage when turned on; and
a pull-down switching device turned on or off according to voltage applied to the reset node, and interconnecting the output terminal of the p-th stage and a third discharging voltage line transferring a third discharging voltage when turned on,
the pull-up switching device and the third switching device being supplied with the same output clock pulse.

8. The gate driving circuit according to claim 7, wherein the p-th stage further comprises at least one selected from among:
- a fifth switching device turned on or off according to a scan pulse from a (p+r)-th (r being a natural number) stage, and interconnecting the set node and the first discharging voltage line when turned on;
- a sixth switching device turned on or off according to voltage applied to the output terminal of the p-th stage, and interconnecting the reset node and the second discharging voltage line when turned on;
- a seventh switching device turned on or off according to the scan pulse from the (p+r)-th stage, and interconnecting the output terminal of the p-th stage and the third discharging voltage line when turned on; and
- an eighth switching device turned on or off according to a scan pulse from a (p−s)-th (s being a natural number) stage, and interconnecting the charging voltage line and the set node when turned on.

9. The gate driving circuit according to claim 1, wherein voltage of each of the m*n output clock pulses in a high period thereof is higher than equal to voltage of each of the n output control clock pulses in a high period thereof.

10. The gate driving circuit according to claim 5, wherein the p-th stage further comprises:
- a third switching device turned on or off according to an output clock pulse from any one of the output clock lines, and interconnecting a charging voltage line transferring a charging voltage and a common node when turned on;
- a fourth switching device turned on or off according to voltage applied to the set node, and interconnecting the common node and a second discharging voltage line transferring a second discharging voltage when turned on;
- a fifth switching device turned on or off according to voltage applied to the common node, and interconnecting the charging voltage line and a reset node when turned on;
- a sixth switching device turned on or off according to voltage applied to the set node, and interconnecting the reset node and the second discharging voltage line when turned on; and
- a pull-down switching device turned on or off according to voltage applied to the reset node, and interconnecting the output terminal of the p-th stage and a third discharging voltage line transferring a third discharging voltage when turned on,
- the pull-up switching device and the third switching device being supplied with the same output clock pulse.

11. The gate driving circuit according to claim 5, wherein the p-th stage further comprises:
- a third switching device turned on or off according to a scan pulse from a (p−r)-th stage, and interconnecting the set node and a charging voltage line transferring a charging voltage when turned on;
- a fourth switching device turned on or off according to voltage applied to the set node, and interconnecting the reset node and a second discharging voltage line transferring a second discharging voltage when turned on;
- a pull-down switching device turned on or off according to voltage applied to the reset node, and interconnecting the output terminal of the p-th stage and a third discharging voltage line transferring a third discharging voltage when turned on; and
- a capacitor connected between the output clock line connected to the pull-up switching device and the reset node.

12. The gate driving circuit according to claim 5, wherein the p-th stage further comprises:
- a third switching device turned on or off according to a scan pulse from a (p−s)-th stage, and interconnecting the set node and a charging voltage line transferring a charging voltage when turned on;
- a fourth switching device turned on or off according to an output clock pulse from any one of the output clock lines, and interconnecting a charging voltage line transferring a charging voltage and a reset node when turned on;
- a fifth switching device turned on or off according to voltage applied to the set node, and interconnecting the reset node and a second discharging voltage line transferring a second discharging voltage when turned on; and
- a pull-down switching device turned on or off according to voltage applied to the reset node, and interconnecting the output terminal of the p-th stage and a third discharging voltage line transferring a third discharging voltage when turned on,
- the fourth switching device and the pull-up switching device being supplied with the same output clock pulse.

13. The gate driving circuit according to claim 5, wherein the p-th stage further comprises:
- a third switching device turned on or off according to voltage applied to the output terminal of the p-th stage, and interconnecting a reset node and a second discharging voltage line transferring a second discharging voltage when turned on;
- a fourth switching device turned on or off according to an output clock pulse from any one of the output clock lines, and interconnecting a charging voltage line transferring a charging voltage and the reset node when turned on;
- a fifth switching device turned on or off according to voltage applied to the set node, and interconnecting the reset node and the second discharging voltage line when turned on; and
- a pull-down switching device turned on or off according to voltage applied to the reset node, and interconnecting the output terminal of the p-th stage and a third discharging voltage line transferring a third discharging voltage when turned on,
- the fourth switching device and the pull-up switching device being supplied with the same output clock pulse.

14. The gate driving circuit according to claim 5, wherein the p-th stage further comprises:
- a third switching device turned on according to a charging voltage from a charging voltage line to interconnect the charging voltage line and a reset node;
- a fourth switching device turned on or off according to an output clock pulse from any one of the output clock lines, and interconnecting the reset node and a second discharging voltage line transferring a second discharging voltage when turned on; and
- a pull-down switching device turned on or off according to voltage applied to the reset node, and interconnecting the output terminal of the p-th stage and a third discharging voltage line transferring a third discharging voltage when turned on,
- the fourth switching device and the pull-up switching device being supplied with the same output clock pulse.

15. The gate driving circuit according to claim 5, wherein the p-th stage further comprises:
- a third switching device turned on according to a charging voltage from a charging voltage line to interconnect the charging voltage line and a reset node;

a fourth switching device turned on or off according to an output clock pulse from any one of the output clock lines, and interconnecting the reset node and a second discharging voltage line transferring a second discharging voltage when turned on;

a fifth switching device turned on or off according to voltage applied to the set node, and interconnecting the reset node and the second discharging voltage line when turned on; and a pull-down switching device turned on or off according to voltage applied to the reset node, and interconnecting the output terminal of the p-th stage and a third discharging voltage line transferring a third discharging voltage when turned on, the fourth switching device and the second switching device being supplied with the same output clock pulse.

16. The gate driving circuit according to claim 5, wherein high periods of the n output control clock pulses do not overlap with one another.

17. The gate driving circuit according to claim 7, wherein at least two of the first to third discharging voltages are the same.

18. The gate driving circuit according to claim 1, wherein the shift register comprises a plurality of stages to sequentially output scan pulses, each of the stages outputs a scan pulse through an output terminal thereof, the n output control clock pulses are transferred through n output control clock lines, the m*n output clock pulses are transferred through m*n output clock lines, a p-th (p being a natural number) stage comprises:
  a first switching device turned on or off according to any one of the n output control clock pulses, and interconnecting an output terminal of a (p−q)-th (q being a natural number less than p) stage or a start transfer line transferring a start pulse and a set node when turned on;
  a pull-up switching device turned on or off according to voltage applied to the set node, and interconnecting any one of the output clock lines and an output terminal of the p-th stage when turned on;
  a third switching device turned on or off according to an output clock pulse from any one of the output clock lines, and interconnecting a charging voltage line transferring a charging voltage and a reset node when turned on;
  a fourth switching device turned on or off according to voltage applied to the set node, and interconnecting the reset node and a second discharging voltage line transferring a second discharging voltage when turned on; and
  a pull-down switching device turned on or off according to voltage applied to the reset node, and interconnecting the output terminal of the p-th stage and a third discharging voltage line transferring a third discharging voltage when turned on, the pull-up switching device and the third switching device are supplied with the same output clock pulse, voltage of each of the n output control clock pulses in a low period thereof is lower than or equal to the second and third discharging voltages, a high period of the output clock pulse supplied to the (p−q)-th stage partially overlaps with a high period of the output clock pulse supplied to the p-th stage, and a rising edge of the output clock pulse supplied to the pull-up switching device is located in a high period of the output control clock pulse supplied to the first switching device.

19. The gate driving circuit according to claim 1, wherein the shift register comprises a plurality of stages to sequentially output scan pulses, each of the stages outputs a scan pulse through an output terminal thereof, the n output control clock pulses are transferred through n output control clock lines, the m*n output clock pulses are transferred through m*n output clock lines, a p-th (p being a natural number) stage comprises:
  a first switching device turned on or off according to any one of the n output control clock pulses, and interconnecting an output terminal of a (p−q)-th (q being a natural number less than p) stage or a start transfer line transferring a start pulse and a set node when turned on;
  a pull-up switching device turned on or off according to voltage applied to the set node, and interconnecting any one of the output clock lines and an output terminal of the p-th stage when turned on;
  a third switching device turned on or off according to an output clock pulse from any one of the output clock lines, and interconnecting the output clock line and a reset node when turned on;
  a fourth switching device turned on or off according to voltage applied to the set node, and interconnecting the reset node and a second discharging voltage line transferring a second discharging voltage when turned on; and
  a pull-down switching device turned on or off according to voltage applied to the reset node, and interconnecting the output terminal of the p-th stage and a third discharging voltage line transferring a third discharging voltage when turned on, the pull-up switching device and the third switching device are supplied with the same output clock pulse, a high period of the output clock pulse does not overlap with a high period of the output control clock pulse supplied to the first switching device, voltage of each of the n output control clock pulses in a low period thereof is lower than or equal to the second and third discharging voltages, a high period of the output clock pulse supplied to the (p−q)-th stage partially overlaps with a high period of the output clock pulse supplied to the p-th stage, and a rising edge of the output clock pulse supplied to the pull-up switching device is located in a high period of the output control clock pulse supplied to the first switching device.

20. The gate driving circuit according to claim 1, wherein the shift register comprises a plurality of stages to sequentially output scan pulses, each of the stages outputs a scan pulse through an output terminal thereof, the n output control clock pulses are transferred through n output control clock lines, the m*n output clock pulses are transferred through m*n output clock lines, a p-th (p being a natural number) stage comprises:
  a first switching device turned on or off according to any one of the n output control clock pulses, and interconnecting an output terminal of a (p−q)-th (q being a natural number less than p) stage or a start transfer line transferring a start pulse and a set node when turned on;

a pull-up switching device turned on or off according to voltage applied to the set node, and interconnecting any one of the output clock lines and an output terminal of the p-th stage when turned on;

a third switching device turned on according to a charging voltage from a charging voltage line to interconnect any one of the output clock lines and a reset node;

a fourth switching device turned on or off according to voltage applied to the set node, and interconnecting the reset node and a second discharging voltage line transferring a second discharging voltage when turned on; and a pull-down switching device turned on or off according to voltage applied to the reset node, and interconnecting the output terminal of the p-th stage and a third discharging voltage line transferring a third discharging voltage when turned on, the pull-up switching device and the third switching device are supplied with the same output clock pulse, a high period of the output clock pulse does not overlap with a high period of the output control clock pulse supplied to the first switching device, voltage of each of the n output control clock pulses in a low period thereof is lower than or equal to the second and third discharging voltages, a high period of the output clock pulse supplied to the (p−q)-th stage partially overlaps with a high period of the output clock pulse supplied to the p-th stage, and a rising edge of the output clock pulse supplied to the pull-up switching device is located in a high period of the output control clock pulse supplied to the first switching device.

21. The gate driving circuit according to claim 1, wherein the shift register comprises a plurality of stages to sequentially output scan pulses, each of the stages outputs a scan pulse through an output terminal thereof, the n output control clock pulses are transferred through n output control clock lines, the m*n output clock pulses are transferred through m*n output clock lines, a p-th (p being a natural number) stage comprises:

a first switching device turned on or off according to any one of the n output control clock pulses, and interconnecting an output terminal of a (p−q)-th (q being a natural number less than p) stage or a start transfer line transferring a start pulse and a set node when turned on;

a pull-up switching device turned on or off according to voltage applied to the set node, and interconnecting any one of the output clock lines and an output terminal of the p-th stage when turned on;

a third switching device turned on or off according to an output clock pulse from any one of the output clock lines, and interconnecting a charging voltage line transferring a charging voltage and a common node when turned on;

a fourth switching device turned on or off according to voltage applied to the set node, and interconnecting the common node and a second discharging voltage line transferring a second discharging voltage when turned on;

a fifth switching device turned on or off according to voltage applied to the common node, and interconnecting the charging voltage line and a reset node when turned on;

a sixth switching device turned on or off according to voltage applied to the set node, and interconnecting the reset node and the second discharging voltage line when turned on; and a pull-down switching device turned on or off according to voltage applied to the reset node, and interconnecting the output terminal of the p-th stage and a third discharging voltage line transferring a third discharging voltage when turned on, a high period of the output clock pulse does not overlap with a high period of the output control clock pulse supplied to the first switching device, voltage of each of the n output control clock pulses in a low period thereof is lower than the second and third discharging voltages, the pull-up switching device and the third switching device are supplied with the same output clock pulse, a high period of the output clock pulse supplied to the (p−q)-th stage partially overlaps with a high period of the output clock pulse supplied to the p-th stage, and a rising edge of the output clock pulse supplied to the pull-up switching device is located in a high period of the output control clock pulse supplied to the first switching device.

* * * * *